(12) United States Patent
Nishimura et al.

(10) Patent No.: US 7,406,940 B2
(45) Date of Patent: Aug. 5, 2008

(54) PISTON FOR INTERNAL COMBUSTION ENGINE

(75) Inventors: Kimio Nishimura, Yokohama (JP); Yutaka Mabuchi, Yokohama (JP); Takahiro Hamada, Yokohama (JP); Makoto Kano, Yokohama (JP); Hidenori Miyake, Kanagawa (JP); Tomohito Ota, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 297 days.

(21) Appl. No.: 10/850,430

(22) Filed: May 21, 2004

(65) Prior Publication Data

US 2005/0005892 A1    Jan. 13, 2005

(30) Foreign Application Priority Data

| May 23, 2003 | (JP) | ............................. 2003-146076 |
| Jun. 12, 2003 | (JP) | ............................. 2003-167440 |
| Jun. 12, 2003 | (JP) | ............................. 2003-167441 |
| Jun. 12, 2003 | (JP) | ............................. 2003-167442 |

(51) Int. Cl.
*F02F 3/00* (2006.01)
*F16J 1/08* (2006.01)
*C23C 16/27* (2006.01)

(52) U.S. Cl. .................. 123/193.6; 123/193.2
(58) Field of Classification Search .............. 123/193.6, 123/193.2, 193.4
See application file for complete search history.

(56) References Cited

U.S. PATENT DOCUMENTS

| 1,461 | A | 12/1839 | Day |
| 2,716,972 | A | 9/1955 | Farny et al. |
| 2,982,733 | A | 5/1961 | Wright et al. |
| 3,211,647 | A | 10/1965 | O'Halloran et al. |
| 3,434,972 | A * | 3/1969 | Lowe .......................... 508/295 |
| 3,790,315 | A | 2/1974 | Emanuelsson et al. |
| 3,846,162 | A | 11/1974 | Bloom |

(Continued)

FOREIGN PATENT DOCUMENTS

CA    2009582    8/1990

(Continued)

OTHER PUBLICATIONS

U.S. Appl. No. 09/545,181, Miyake et al., filed Apr. 7, 2000.

(Continued)

*Primary Examiner*—M. McMahon
*Assistant Examiner*—Stephen K Cronin
(74) *Attorney, Agent, or Firm*—Foley & Lardner LLP

(57) ABSTRACT

A piston for an internal combustion engine of an automotive vehicle. The piston has a piston ring and a piston skirt section each of which has a sliding section in slidable contact with a cylinder bore section of a cylinder block in presence of a lubricating oil. The cylinder bore section is formed of eutectic or hyper-eutectic aluminum alloy. Additionally, a hard carbon thin film is coated on the sliding section of the piston and contains hydrogen atom in an amount of not more than 1 atomic %. Here, the lubricating oil contains at least one selected from the group consisting of ashless fatty acid ester friction modifier, ashless aliphatic amine friction modifier, polybutenyl succinimide, derivative of polybutenyl succinimide, zinc dithiophosphate, and derivative of zinc dithiophosphate.

35 Claims, 4 Drawing Sheets

U.S. PATENT DOCUMENTS

| | | | |
|---|---|---|---|
| 3,932,228 A | 1/1976 | Sugiyama et al. | |
| 4,031,023 A | 6/1977 | Musser et al. | |
| 4,367,130 A | 1/1983 | Lemelson | |
| 4,385,880 A | 5/1983 | Lemelson | |
| 4,395,442 A * | 7/1983 | Meise et al. | 427/236 |
| 4,538,929 A | 9/1985 | Ehrentraut et al. | |
| 4,554,208 A | 11/1985 | MacIver et al. | |
| 4,645,610 A | 2/1987 | Born et al. | |
| 4,702,808 A | 10/1987 | Lemelson | |
| 4,755,237 A | 7/1988 | Lemelson | |
| 4,755,426 A | 7/1988 | Kokai et al. | |
| 4,783,368 A | 11/1988 | Yamamoto et al. | |
| 4,834,400 A | 5/1989 | Lebeck | |
| 4,842,755 A | 6/1989 | Dunn | |
| 4,859,493 A | 8/1989 | Lemelson | |
| 4,874,596 A | 10/1989 | Lemelson | |
| 4,919,974 A | 4/1990 | McCune et al. | |
| 4,933,058 A | 6/1990 | Bache et al. | |
| 4,943,345 A | 7/1990 | Asmussen et al. | |
| 4,974,498 A * | 12/1990 | Lemelson | 92/223 |
| 4,980,021 A | 12/1990 | Kitamura et al. | |
| 4,980,610 A | 12/1990 | Varga | |
| 4,981,717 A | 1/1991 | Thaler | |
| 4,988,421 A | 1/1991 | Drawl et al. | |
| 4,992,082 A | 2/1991 | Drawl et al. | |
| 5,000,541 A | 3/1991 | DiMarcello et al. | |
| 5,021,628 A | 6/1991 | Lemelson | |
| 5,032,243 A | 7/1991 | Bache et al. | |
| 5,036,211 A | 7/1991 | Scott | |
| 5,040,501 A | 8/1991 | Lemelson | |
| 5,067,826 A | 11/1991 | Lemelson | |
| 5,077,990 A | 1/1992 | Plath | |
| 5,078,848 A | 1/1992 | Anttila et al. | |
| 5,087,608 A | 2/1992 | Chan et al. | |
| 5,096,352 A | 3/1992 | Lemelson | |
| 5,110,435 A | 5/1992 | Haberland | |
| 5,112,025 A | 5/1992 | Nakayama et al. | |
| 5,127,314 A | 7/1992 | Swain | |
| 5,131,941 A | 7/1992 | Lemelson | |
| 5,132,587 A | 7/1992 | Lemelson | |
| 5,142,785 A | 9/1992 | Grewal et al. | |
| 5,143,634 A | 9/1992 | Quinga et al. | |
| 5,148,780 A | 9/1992 | Urano et al. | |
| 5,187,021 A | 2/1993 | Vydra et al. | |
| 5,190,807 A | 3/1993 | Kimock et al. | |
| 5,190,824 A | 3/1993 | Itoh | |
| 5,202,156 A | 4/1993 | Yamamoto et al. | |
| 5,205,188 A | 4/1993 | Repenning et al. | |
| 5,205,305 A | 4/1993 | Yamakita | |
| H1210 H | 7/1993 | Jansen | |
| 5,232,568 A | 8/1993 | Parent et al. | |
| 5,237,967 A | 8/1993 | Willermet et al. | |
| 5,249,554 A | 10/1993 | Tamor et al. | |
| 5,255,783 A | 10/1993 | Goodman et al. | |
| 5,255,929 A | 10/1993 | Lemelson | |
| 5,284,394 A | 2/1994 | Lemelson | |
| 5,288,556 A | 2/1994 | Lemelson | |
| 5,295,305 A | 3/1994 | Hahn et al. | |
| 5,299,937 A | 4/1994 | Gow | |
| 5,317,938 A | 6/1994 | de Juan, Jr. et al. | |
| 5,326,488 A | 7/1994 | Minokami et al. | |
| 5,332,348 A | 7/1994 | Lemelson | |
| 5,334,306 A | 8/1994 | Dautremont-Smith et al. | |
| 5,349,265 A | 9/1994 | Lemelson | |
| 5,358,402 A | 10/1994 | Reed et al. | |
| 5,359,170 A | 10/1994 | Chen et al. | |
| 5,360,227 A | 11/1994 | Lemelson | |
| 5,380,196 A | 1/1995 | Kelly et al. | |
| 5,401,543 A | 3/1995 | O'Neill et al. | |
| H1461 H | 7/1995 | DiVita et al. | |
| 5,432,539 A | 7/1995 | Anderson | |
| 5,433,977 A | 7/1995 | Sarin et al. | |
| H1471 H | 8/1995 | Braun et al. | |
| 5,443,032 A | 8/1995 | Vichr et al. | |
| 5,447,208 A | 9/1995 | Lund et al. | |
| 5,456,406 A | 10/1995 | Lemelson | |
| 5,458,754 A | 10/1995 | Sathrum et al. | |
| 5,461,648 A | 10/1995 | Nauflett et al. | |
| 5,462,772 A | 10/1995 | Lemelson | |
| 5,464,667 A | 11/1995 | Köhler et al. | |
| 5,466,431 A | 11/1995 | Dorfman et al. | |
| 5,479,069 A | 12/1995 | Winsor | |
| 5,482,602 A | 1/1996 | Cooper et al. | |
| 5,491,028 A | 2/1996 | Sarin et al. | |
| 5,497,550 A | 3/1996 | Trotta et al. | |
| 5,509,841 A | 4/1996 | Winsor | |
| 5,516,729 A | 5/1996 | Dawson et al. | |
| 5,529,815 A | 6/1996 | Lemelson | |
| 5,531,878 A | 7/1996 | Vadgama et al. | |
| 5,541,566 A | 7/1996 | Deeney | |
| 5,547,716 A | 8/1996 | Thaler | |
| 5,551,959 A | 9/1996 | Martin et al. | |
| 5,552,675 A | 9/1996 | Lemelson | |
| 5,568,391 A | 10/1996 | Mckee | |
| 5,593,719 A | 1/1997 | Dearnaley et al. | |
| 5,616,372 A | 4/1997 | Conley et al. | |
| 5,619,889 A | 4/1997 | Jones et al. | |
| 5,628,881 A | 5/1997 | Lemelson | |
| 5,630,275 A | 5/1997 | Wexler | |
| 5,630,953 A | 5/1997 | Klink | |
| 5,653,300 A | 8/1997 | Lund et al. | |
| 5,669,144 A | 9/1997 | Hahn et al. | |
| 5,672,054 A | 9/1997 | Cooper et al. | |
| 5,688,557 A | 11/1997 | Lemelson et al. | |
| 5,707,409 A | 1/1998 | Martin et al. | |
| 5,714,202 A | 2/1998 | Lemelson et al. | |
| 5,719,109 A | 2/1998 | Tokashiki et al. | |
| 5,723,207 A | 3/1998 | Lettington et al. | |
| 5,731,046 A | 3/1998 | Mistry et al. | |
| 5,735,769 A | 4/1998 | Takemura et al. | |
| 5,740,941 A | 4/1998 | Lemelson | |
| 5,775,817 A | 7/1998 | Gottemoller et al. | |
| 5,786,038 A | 7/1998 | Conley et al. | |
| 5,790,146 A | 8/1998 | Anderson | |
| 5,793,390 A | 8/1998 | Claflin et al. | |
| 5,794,801 A | 8/1998 | Lemelson | |
| 5,799,549 A | 9/1998 | Decker et al. | |
| 5,806,557 A | 9/1998 | Helge | |
| 5,824,387 A | 10/1998 | Boutaghou et al. | |
| 5,834,708 A | 11/1998 | Svetal et al. | |
| 5,840,662 A | 11/1998 | Nibert et al. | |
| 5,843,571 A | 12/1998 | Sho | |
| 5,851,962 A | 12/1998 | Kaga | |
| 5,866,195 A | 2/1999 | Lemelson | |
| 5,871,805 A | 2/1999 | Lemelson | |
| 5,881,444 A | 3/1999 | Schaefer et al. | |
| 5,901,021 A | 5/1999 | Hirano et al. | |
| 5,910,940 A | 6/1999 | Guerra | |
| 5,927,897 A | 7/1999 | Attar | |
| 5,937,812 A | 8/1999 | Reedy et al. | |
| 5,940,975 A | 8/1999 | Decker et al. | |
| 5,945,214 A | 8/1999 | Ma et al. | |
| 5,947,710 A | 9/1999 | Cooper et al. | |
| 5,952,102 A | 9/1999 | Cutler | |
| 5,958,261 A | 9/1999 | Offer et al. | |
| 5,960,762 A | 10/1999 | Imai | |
| 5,967,250 A | 10/1999 | Lund et al. | |
| 5,968,596 A | 10/1999 | Ma et al. | |
| 5,975,686 A | 11/1999 | Hauck et al. | |
| 5,976,707 A | 11/1999 | Grab | |
| 5,992,268 A | 11/1999 | Decker et al. | |
| 5,993,938 A | 11/1999 | Tsukuda et al. | |
| 6,006,415 A | 12/1999 | Schaefer et al. | |
| 6,015,597 A | 1/2000 | David | |

| | | | |
|---|---|---|---|
| 6,016,000 A | 1/2000 | Moslehi | |
| 6,023,979 A | 2/2000 | Bills et al. | |
| 6,028,393 A | 2/2000 | Izu et al. | |
| 6,051,298 A | 4/2000 | Ko et al. | |
| 6,056,443 A | 5/2000 | Koike et al. | |
| 6,059,460 A | 5/2000 | Ono et al. | |
| 6,059,830 A | 5/2000 | Lippincott, III et al. | |
| 6,071,597 A | 6/2000 | Yang et al. | |
| 6,083,313 A | 7/2000 | Venkatraman et al. | |
| 6,083,570 A | 7/2000 | Lemelson et al. | |
| 6,095,690 A | 8/2000 | Niegel et al. | |
| 6,099,541 A | 8/2000 | Klopotek | |
| 6,099,976 A | 8/2000 | Lemelson et al. | |
| 6,106,919 A | 8/2000 | Lee et al. | |
| 6,124,198 A | 9/2000 | Moslehi | |
| 6,139,964 A | 10/2000 | Sathrum et al. | |
| 6,142,481 A * | 11/2000 | Iwashita et al. | 277/443 |
| 6,145,608 A | 11/2000 | Lund et al. | |
| 6,156,439 A | 12/2000 | Coffinberry | |
| 6,159,558 A | 12/2000 | Wolfe et al. | |
| 6,160,683 A | 12/2000 | Boutaghou | |
| 6,165,616 A | 12/2000 | Lemelson et al. | |
| 6,170,156 B1 | 1/2001 | Lev et al. | |
| 6,171,343 B1 | 1/2001 | Dearnaley et al. | |
| 6,173,913 B1 | 1/2001 | Shafer et al. | |
| 6,190,514 B1 | 2/2001 | Ma et al. | |
| 6,193,906 B1 | 2/2001 | Kaneko et al. | |
| 6,197,120 B1 | 3/2001 | David | |
| 6,197,428 B1 | 3/2001 | Rogers | |
| 6,203,651 B1 | 3/2001 | Järvenkylä et al. | |
| 6,205,291 B1 | 3/2001 | Hughes et al. | |
| 6,207,625 B1 * | 3/2001 | Ogano et al. | 508/365 |
| 6,227,056 B1 | 5/2001 | Bills et al. | |
| 6,237,441 B1 | 5/2001 | Nishioka | |
| 6,237,852 B1 | 5/2001 | Svetal et al. | |
| 6,238,839 B1 | 5/2001 | Tomita et al. | |
| 6,255,262 B1 | 7/2001 | Keenan et al. | |
| 6,261,424 B1 | 7/2001 | Goncharenko et al. | |
| 6,273,793 B1 | 8/2001 | Liners et al. | |
| 6,274,220 B1 | 8/2001 | Tsukuda et al. | |
| 6,289,593 B1 | 9/2001 | Decker et al. | |
| 6,293,648 B1 | 9/2001 | Anderson | |
| 6,296,552 B1 | 10/2001 | Boutaghou et al. | |
| 6,299,425 B1 * | 10/2001 | Hirano et al. | 418/63 |
| 6,305,416 B1 | 10/2001 | Snel et al. | |
| 6,309,283 B1 | 10/2001 | Liners et al. | |
| 6,311,524 B1 | 11/2001 | Brennan, III et al. | |
| 6,316,734 B1 | 11/2001 | Yang | |
| 6,322,431 B1 | 11/2001 | Schaenzer et al. | |
| 6,322,719 B2 | 11/2001 | Kaneko et al. | |
| 6,324,060 B1 | 11/2001 | Hsu | |
| 6,325,385 B1 | 12/2001 | Iwashita et al. | |
| 6,329,328 B1 * | 12/2001 | Koganei et al. | 508/365 |
| 6,333,298 B1 | 12/2001 | Waddoups et al. | |
| 6,338,881 B1 | 1/2002 | Sellschopp et al. | |
| 6,340,245 B1 | 1/2002 | Horton et al. | |
| 6,358,123 B1 | 3/2002 | Liners et al. | |
| 6,367,705 B1 | 4/2002 | Lee et al. | |
| 6,368,676 B1 | 4/2002 | Gaudreau et al. | |
| 6,377,422 B1 | 4/2002 | Boutaghou et al. | |
| 6,379,383 B1 | 4/2002 | Palmaz et al. | |
| 6,385,987 B2 | 5/2002 | Schlom et al. | |
| 6,386,468 B1 | 5/2002 | Neuberger et al. | |
| 6,399,215 B1 | 6/2002 | Zhu et al. | |
| 6,401,058 B1 | 6/2002 | Akalin et al. | |
| 6,439,845 B1 | 8/2002 | Veres | |
| 6,439,986 B1 | 8/2002 | Myoung et al. | |
| 6,452,752 B1 | 9/2002 | Boutaghou | |
| 6,468,642 B1 | 10/2002 | Bray et al. | |
| 6,471,979 B2 | 10/2002 | New et al. | |
| 6,494,881 B1 | 12/2002 | Bales et al. | |
| 6,523,456 B1 | 2/2003 | Kobayashi et al. | |
| 6,524,212 B2 | 2/2003 | Ushijima et al. | |
| 6,534,141 B1 | 3/2003 | Hull, Jr. et al. | |
| 6,537,310 B1 | 3/2003 | Palmaz et al. | |
| 6,537,429 B2 | 3/2003 | O'Donnell et al. | |
| 6,543,394 B2 | 4/2003 | Tinney | |
| 6,544,308 B2 | 4/2003 | Griffin et al. | |
| 6,553,957 B1 | 4/2003 | Ishikawa et al. | |
| 6,557,968 B2 | 5/2003 | Lee et al. | |
| 6,562,445 B2 | 5/2003 | Iwamura | |
| 6,562,462 B2 | 5/2003 | Griffin et al. | |
| 6,570,172 B2 | 5/2003 | Kim et al. | |
| 6,572,651 B1 | 6/2003 | DeScheerder et al. | |
| 6,572,935 B1 | 6/2003 | He et al. | |
| 6,572,937 B2 | 6/2003 | Hakovirta et al. | |
| 6,585,064 B2 | 7/2003 | Griffin et al. | |
| 6,586,069 B2 | 7/2003 | Dykes et al. | |
| 6,589,640 B2 | 7/2003 | Griffin et al. | |
| 6,592,519 B1 | 7/2003 | Martinez | |
| 6,592,985 B2 | 7/2003 | Griffin et al. | |
| 6,601,662 B2 | 8/2003 | Matthias et al. | |
| 6,626,949 B1 | 9/2003 | Townley | |
| 6,629,906 B1 | 10/2003 | Chiba et al. | |
| 6,637,528 B2 | 10/2003 | Nishiyama et al. | |
| 6,638,569 B2 | 10/2003 | McLaughlin et al. | |
| 6,645,354 B1 | 11/2003 | Gorokhovsky | |
| 6,656,329 B1 | 12/2003 | Ma et al. | |
| 6,658,941 B1 | 12/2003 | Bills et al. | |
| 6,666,328 B2 | 12/2003 | Sykora | |
| 6,666,671 B1 | 12/2003 | Olver et al. | |
| 6,684,513 B1 | 2/2004 | Clipstone et al. | |
| 6,684,759 B1 | 2/2004 | Gorokhovsky | |
| 6,695,865 B2 | 2/2004 | Boyle et al. | |
| 6,699,106 B2 | 3/2004 | Myoung et al. | |
| 6,701,627 B2 | 3/2004 | Korb et al. | |
| 6,715,693 B1 | 4/2004 | Dam et al. | |
| 6,726,993 B2 | 4/2004 | Teer et al. | |
| 6,729,350 B2 | 5/2004 | Schick | |
| 6,729,527 B2 | 5/2004 | Sonnenreich et al. | |
| 6,733,513 B2 | 5/2004 | Boyle et al. | |
| 6,739,214 B2 | 5/2004 | Griffin et al. | |
| 6,739,238 B2 | 5/2004 | Ushijima et al. | |
| 6,740,393 B1 | 5/2004 | Massler et al. | |
| 6,745,742 B2 | 6/2004 | Meyer | |
| 6,749,033 B2 | 6/2004 | Griffin et al. | |
| 6,753,042 B1 | 6/2004 | Bakounine et al. | |
| 6,753,635 B2 | 6/2004 | Kuhlmann-Wilsdorf | |
| 6,761,532 B2 | 7/2004 | Capone et al. | |
| 6,761,736 B1 | 7/2004 | Woo et al. | |
| 6,780,177 B2 | 8/2004 | Shafirstein et al. | |
| 6,797,326 B2 | 9/2004 | Griffin et al. | |
| 6,799,468 B2 | 10/2004 | Borenstein | |
| 6,806,242 B2 | 10/2004 | Shirahama et al. | |
| 6,818,029 B2 | 11/2004 | Myoung et al. | |
| 6,820,676 B2 | 11/2004 | Palmaz et al. | |
| 6,821,189 B1 | 11/2004 | Coad et al. | |
| 6,821,624 B2 | 11/2004 | Utsumi et al. | |
| 6,822,788 B2 | 11/2004 | Blitstein | |
| 6,849,085 B2 | 2/2005 | Marton | |
| 6,855,237 B2 | 2/2005 | Kolpakov et al. | |
| 6,855,791 B2 | 2/2005 | Van Doren et al. | |
| 6,861,098 B2 | 3/2005 | Griffin et al. | |
| 6,861,137 B2 | 3/2005 | Griffin et al. | |
| 6,865,952 B2 | 3/2005 | Bills et al. | |
| 6,866,894 B2 | 3/2005 | Trankiem et al. | |
| 6,871,700 B2 | 3/2005 | Gorokhovsky | |
| 6,872,203 B2 | 3/2005 | Shafirstein et al. | |
| 6,878,447 B2 | 4/2005 | Griffin et al. | |
| 6,880,469 B2 | 4/2005 | Frost | |
| 6,882,094 B2 | 4/2005 | Dimitrijevic et al. | |
| 6,883,476 B1 | 4/2005 | Nohara et al. | |
| 6,886,521 B2 | 5/2005 | Hamada et al. | |
| 6,887,585 B2 | 5/2005 | Herbst-Dederichs | |
| 6,890,700 B2 | 5/2005 | Tomita et al. | |
| 6,893,720 B1 | 5/2005 | Nakahigashi et al. | |

| | | |
|---|---|---|
| 6,969,198 B2 | 11/2005 | Konishi et al. |
| 2001/0036800 A1 | 11/2001 | Liners et al. |
| 2002/0022129 A1* | 2/2002 | Moronuki .................. 428/408 |
| 2002/0026899 A1 | 3/2002 | McLaughlin et al. |
| 2002/0031987 A1 | 3/2002 | Liners et al. |
| 2002/0034631 A1 | 3/2002 | Griffin et al. |
| 2002/0034632 A1 | 3/2002 | Griffin et al. |
| 2002/0051286 A1 | 5/2002 | Blitstein |
| 2002/0070357 A1 | 6/2002 | Kim et al. |
| 2002/0074168 A1 | 6/2002 | Matthias et al. |
| 2002/0089571 A1 | 7/2002 | Lee et al. |
| 2002/0090155 A1 | 7/2002 | Ushijima et al. |
| 2002/0090578 A1 | 7/2002 | Schaefera et al. |
| 2002/0130219 A1 | 9/2002 | Parseghian et al. |
| 2002/0148430 A1 | 10/2002 | Kano et al. |
| 2002/0155015 A1 | 10/2002 | Esumi et al. |
| 2002/0175476 A1* | 11/2002 | Chinou et al. ............... 277/440 |
| 2003/0012234 A1 | 1/2003 | Watson et al. |
| 2003/0019111 A1 | 1/2003 | Korb et al. |
| 2003/0019332 A1 | 1/2003 | Korb et al. |
| 2003/0021995 A1 | 1/2003 | Griffin et al. |
| 2003/0034182 A1 | 2/2003 | Griffin et al. |
| 2003/0035957 A1 | 2/2003 | Griffin et al. |
| 2003/0035958 A1 | 2/2003 | Griffin et al. |
| 2003/0036341 A1 | 2/2003 | Myoung et al. |
| 2003/0037640 A1 | 2/2003 | Griffin et al. |
| 2003/0069632 A1 | 4/2003 | De Scheerder et al. |
| 2003/0108777 A1 | 6/2003 | Gunsel et al. |
| 2003/0114094 A1 | 6/2003 | Myoung et al. |
| 2003/0128903 A1 | 7/2003 | Yasuda et al. |
| 2003/0159919 A1 | 8/2003 | Fairbaim et al. |
| 2003/0162672 A1 | 8/2003 | Shirahama et al. |
| 2003/0168323 A1 | 9/2003 | Frost |
| 2003/0180565 A1 | 9/2003 | Herbst-Dederichs |
| 2003/0199741 A1 | 10/2003 | Martinez |
| 2003/0234371 A1 | 12/2003 | Ziegler |
| 2003/0235691 A1 | 12/2003 | Griffin et al. |
| 2004/0003638 A1 | 1/2004 | Schaefer et al. |
| 2004/0008406 A1 | 1/2004 | Blitstein |
| 2004/0010068 A1 | 1/2004 | Doren et al. |
| 2004/0011900 A1 | 1/2004 | Gebhardt et al. |
| 2004/0027018 A1 | 2/2004 | LeBlanc et al. |
| 2004/0035375 A1 | 2/2004 | Gibisch et al. |
| 2004/0074467 A1 | 4/2004 | Hamada et al. |
| 2004/0092405 A1 | 5/2004 | Konishi et al. |
| 2004/0105806 A1 | 6/2004 | Griffin et al. |
| 2004/0109621 A1 | 6/2004 | Frost |
| 2004/0115435 A1 | 6/2004 | Griffin et al. |
| 2004/0133301 A1 | 7/2004 | Van Doren et al. |
| 2004/0154570 A1 | 8/2004 | Mabuchi et al. |
| 2004/0168326 A1 | 9/2004 | Korb et al. |
| 2004/0184687 A1 | 9/2004 | Morales et al. |
| 2004/0223256 A1 | 11/2004 | Feng et al. |
| 2004/0241448 A1 | 12/2004 | Kano et al. |
| 2004/0242435 A1 | 12/2004 | Nishimura et al. |
| 2004/0244539 A1 | 12/2004 | Korb et al. |
| 2004/0261614 A1 | 12/2004 | Hamada et al. |
| 2005/0001201 A1 | 1/2005 | Bocko et al. |
| 2005/0025975 A1 | 2/2005 | Okamoto et al. |
| 2005/0035222 A1 | 2/2005 | Hamada et al. |
| 2005/0037879 A1 | 2/2005 | Murata et al. |
| 2005/0056241 A1 | 3/2005 | Nomura et al. |
| 2005/0061291 A1 | 3/2005 | Nishimura et al. |
| 2005/0061636 A1 | 3/2005 | Frost et al. |
| 2005/0064196 A1 | 3/2005 | Martin et al. |
| 2005/0082139 A1 | 4/2005 | Ishikawa et al. |
| 2005/0084390 A1 | 4/2005 | Ueno et al. |
| 2005/0089685 A1 | 4/2005 | Hamada et al. |
| 2005/0098134 A1 | 5/2005 | Nishimura et al. |
| 2005/0100701 A1 | 5/2005 | Hamada et al. |
| 2005/0115744 A1 | 6/2005 | Griffin et al. |
| 2005/0188942 A1 | 9/2005 | Hamada et al. |

FOREIGN PATENT DOCUMENTS

| | | |
|---|---|---|
| DE | 643 034 | 3/1937 |
| DE | 19507086 A1 | 9/1996 |
| DE | 19507086 C2 | 9/1996 |
| DE | 197 04 224 | 8/1997 |
| DE | 198 15 989 | 10/1999 |
| DE | 198 25 860 | 12/1999 |
| DE | 19825860 A1 | 12/1999 |
| DE | 100 17 459 | 10/2000 |
| DE | 100 61 397 A1 | 5/2002 |
| DE | 101 58 683 | 8/2003 |
| DE | 103 18 135 | 11/2003 |
| DE | 10337559 A1 | 3/2005 |
| EP | 0 286 996 | 10/1988 |
| EP | 0 291 006 A2 | 11/1988 |
| EP | 0 299 785 | 1/1989 |
| EP | 0308143 B1 | 3/1989 |
| EP | 0 333 416 | 9/1989 |
| EP | 0378378 B1 | 7/1990 |
| EP | 0384772 A1 | 8/1990 |
| EP | 0388800 A2 | 9/1990 |
| EP | 0392125 A1 | 10/1990 |
| EP | 0398985 B1 | 11/1990 |
| EP | 407977 | 1/1991 |
| EP | 0 435 312 | 7/1991 |
| EP | 0474369 A1 | 3/1992 |
| EP | 0 500 253 | 8/1992 |
| EP | 0511153 A1 | 10/1992 |
| EP | 0 529 327 | 3/1993 |
| EP | 0392125 B1 | 3/1993 |
| EP | 0546824 A1 | 6/1993 |
| EP | 0308143 A1 | 11/1993 |
| EP | 0573943 A1 | 12/1993 |
| EP | 0619504 A1 | 10/1994 |
| EP | 0621136 A2 | 10/1994 |
| EP | 0624353 A3 | 11/1994 |
| EP | 0624354 A3 | 11/1994 |
| EP | 0378378 B1 | 1/1995 |
| EP | 0651069 A1 | 5/1995 |
| EP | 0652301 A1 | 5/1995 |
| EP | 0656458 A3 | 6/1995 |
| EP | 0 661 470 | 7/1995 |
| EP | 0396603 B1 | 6/1996 |
| EP | 0388800 B1 | 12/1996 |
| EP | 0 759 519 A2 | 2/1997 |
| EP | 0474369 B1 | 3/1997 |
| EP | 0 818 622 | 1/1998 |
| EP | 0652301 B1 | 1/1998 |
| EP | 0826790 A1 | 3/1998 |
| EP | 0842754 A1 | 5/1998 |
| EP | 0 870 820 A1 | 10/1998 |
| EP | 0816112 A3 | 10/1998 |
| EP | 0882759 A1 | 12/1998 |
| EP | 0893677 B1 | 1/1999 |
| EP | 0624353 B1 | 2/1999 |
| EP | 0656458 B1 | 2/1999 |
| EP | 0 905 221 A1 | 3/1999 |
| EP | 0 905 419 | 3/1999 |
| EP | 0647318 B1 | 3/1999 |
| EP | 0651069 B1 | 3/1999 |
| EP | 0 731 190 B1 | 5/1999 |
| EP | 0949200 A1 | 10/1999 |
| EP | 0845154 B1 | 11/1999 |
| EP | 0624354 B1 | 12/1999 |
| EP | 0582676 B1 | 3/2000 |
| EP | 1063085 A1 | 12/2000 |
| EP | 1 067 211 | 1/2001 |
| EP | 0850126 B1 | 1/2001 |
| EP | 1076087 | 2/2001 |

| | | | | | | |
|---|---|---|---|---|---|---|
| EP | 1078736 | A1 | 2/2001 | JP | 2000-504089 | 4/2000 |
| EP | 1109196 | A1 | 6/2001 | JP | 2000-297373 | 10/2000 |
| EP | 0778902 | B1 | 9/2001 | JP | 2000-327484 | 11/2000 |
| EP | 1 154 012 | A2 | 11/2001 | JP | 2000-339083 A | 12/2000 |
| EP | 0826790 | B1 | 11/2001 | JP | 2001-62605 | 3/2001 |
| EP | 1034320 | B1 | 12/2001 | JP | 2001-64005 | 3/2001 |
| EP | 0850133 | B1 | 1/2002 | JP | 2001-93141 A2 | 4/2001 |
| EP | 0893677 | B1 | 1/2002 | JP | 2001-172766 A2 | 6/2001 |
| EP | 1184480 | A2 | 3/2002 | JP | 2001-192864 A | 7/2001 |
| EP | 1190791 | A3 | 4/2002 | JP | 2001-269938 | 10/2001 |
| EP | 1219464 | A2 | 7/2002 | JP | 2001-280236 | 10/2001 |
| EP | 1 233 054 | A1 | 8/2002 | JP | 2002-265968 A2 | 9/2002 |
| EP | 0971812 | B1 | 10/2002 | JP | 2002-309912 | 10/2002 |
| EP | 1018291 | B1 | 10/2002 | JP | 2002-332571 | 11/2002 |
| EP | 1281513 | A2 | 2/2003 | JP | 2003-13163 A | 1/2003 |
| EP | 1 300 608 | | 4/2003 | JP | 2003-13799 A | 1/2003 |
| EP | 0950123 | B1 | 5/2003 | JP | 2003-25117 | 1/2003 |
| EP | 0882759 | B1 | 6/2003 | JP | 2003-28174 A2 | 1/2003 |
| EP | 1 338 641 | | 8/2003 | JP | 2003-88939 | 3/2003 |
| EP | 1340605 | A1 | 9/2003 | JP | 2003-113941 A | 4/2003 |
| EP | 1365141 | A1 | 11/2003 | JP | 2003-147508 | 5/2003 |
| EP | 1083946 | B1 | 12/2003 | JP | 2004-36788 A2 | 2/2004 |
| EP | 1078736 | B1 | 1/2004 | JP | 2005-68529 A2 | 3/2005 |
| EP | 1378271 | A1 | 1/2004 | RU | 2004586 C1 | 12/1993 |
| EP | 0757615 | B1 | 3/2004 | RU | 2153782 C1 | 7/2000 |
| EP | 0842754 | B1 | 3/2004 | SU | 1770350 A1 | 10/1992 |
| EP | 1 411 145 | | 4/2004 | WO | WO 89/06707 A1 | 7/1989 |
| EP | 0862395 | B1 | 4/2004 | WO | WO 89/06708 A1 | 7/1989 |
| EP | 1 418 353 | A2 | 5/2004 | WO | WO 8906338 A1 | 7/1989 |
| EP | 1440775 | A1 | 7/2004 | WO | WO 92/02602 | 2/1992 |
| EP | 145119 | A1 | 8/2004 | WO | WO 9206843 A1 | 4/1992 |
| EP | 1475557 | A1 | 11/2004 | WO | WO 9219425 A2 | 11/1992 |
| EP | 1481699 | A1 | 12/2004 | WO | WO 93/21288 | 10/1993 |
| EP | 1482190 | A2 | 12/2004 | WO | WO 93/21289 | 10/1993 |
| EP | 1498597 | A1 | 1/2005 | WO | WO 9324828 A1 | 12/1993 |
| EP | 1 510 594 | A2 | 3/2005 | WO | WO 95/20253 A2 | 7/1995 |
| EP | 1311885 | B1 | 3/2005 | WO | WO 95/29044 A1 | 11/1995 |
| EP | 1512781 | A2 | 3/2005 | WO | WO 95/29273 A1 | 11/1995 |
| EP | 1183470 | B1 | 4/2005 | WO | WO 95/31584 A1 | 11/1995 |
| FR | 2 669 689 | | 5/1992 | WO | WO 96/04485 | 2/1996 |
| GB | 768226 | | 2/1957 | WO | WO 96/05333 A1 | 2/1996 |
| GB | 1005638 | | 10/1988 | WO | WO 96/05942 A1 | 2/1996 |
| GB | 2338716 | | 12/1999 | WO | WO 96/06961 A1 | 3/1996 |
| IE | 0990532 | A1 | 3/2001 | WO | WO 96/12389 A1 | 4/1996 |
| JP | 62-111106 | | 5/1987 | WO | WO 96/24488 A1 | 8/1996 |
| JP | 63-21209 | A2 | 1/1988 | WO | WO 96/40446 A1 | 12/1996 |
| JP | 63-288994 | A2 | 11/1988 | WO | WO 97/07531 A1 | 2/1997 |
| JP | 5-70879 | | 3/1993 | WO | WO 97/10093 A1 | 3/1997 |
| JP | 5-36004 | | 5/1993 | WO | WO 97/10940 A1 | 3/1997 |
| JP | 5-42616 | | 6/1993 | WO | WO 97/14555 | 4/1997 |
| JP | 6-264993 | | 9/1994 | WO | WO 97/16138 A1 | 5/1997 |
| JP | 6-294307 | A | 10/1994 | WO | WO 98/02715 A1 | 1/1998 |
| JP | 7-63135 | | 3/1995 | WO | WO 98/12994 A1 | 4/1998 |
| JP | 7-90553 | A | 4/1995 | WO | WO 98/13528 A1 | 4/1998 |
| JP | 7-103238 | | 4/1995 | WO | WO 98/47141 A1 | 10/1998 |
| JP | 07-118832 | | 5/1995 | WO | WO 99/09547 A1 | 2/1999 |
| JP | 7-41386 | A2 | 10/1995 | WO | WO 99/12404 A1 | 3/1999 |
| JP | 7-286696 | | 10/1995 | WO | WO 99/14512 A1 | 3/1999 |
| JP | 8-14014 | | 1/1996 | WO | WO 99/16371 A1 | 4/1999 |
| JP | 8-61499 | | 3/1996 | WO | WO 99/22694 A2 | 5/1999 |
| JP | 9-20981 | A2 | 1/1997 | WO | WO 99/27157 A1 | 6/1999 |
| JP | 52006318 | | 1/1997 | WO | WO 99/29477 A1 | 6/1999 |
| JP | 253770 | A2 | 9/1997 | WO | WO 99/31557 A1 | 6/1999 |
| JP | 10-088369 | A2 | 4/1998 | WO | WO 99/34385 A1 | 7/1999 |
| JP | 10-265790 | | 10/1998 | WO | WO 99/46847 A1 | 9/1999 |
| JP | 10-298440 | A2 | 11/1998 | WO | WO 99/54520 A1 | 10/1999 |
| JP | 11-22423 | | 1/1999 | WO | WO 99/54934 A1 | 10/1999 |
| JP | 11-190406 | | 7/1999 | WO | WO 99/57743 A1 | 11/1999 |
| JP | 11-292629 | A2 | 10/1999 | WO | WO 99/62077 A1 | 12/1999 |
| JP | 11-294118 | | 10/1999 | WO | WO 99/62572 A1 | 12/1999 |
| JP | 11-333773 | A2 | 12/1999 | WO | WO 00/22613 A1 | 4/2000 |
| JP | 2000-88104 | A | 3/2000 | WO | WO 00/24554 A1 | 5/2000 |
| JP | 2000-119843 | | 4/2000 | WO | WO 00/25410 A1 | 5/2000 |

| | | |
|---|---|---|
| WO | WO 00/28142 A1 | 5/2000 |
| WO | WO 00/33051 A1 | 6/2000 |
| WO | WO 00/35000 A1 | 6/2000 |
| WO | WO 00/44032 A1 | 7/2000 |
| WO | WO 00/47402 A1 | 8/2000 |
| WO | WO 00/55385 A1 | 9/2000 |
| WO | WO 00/56127 A1 | 9/2000 |
| WO | WO 00/56393 A1 | 9/2000 |
| WO | WO 00/62327 A2 | 10/2000 |
| WO | WO 00/68451 A2 | 11/2000 |
| WO | WO 00/75517 A1 | 12/2000 |
| WO | WO 00/78504 A1 | 12/2000 |
| WO | WO 01/05917 | 1/2001 |
| WO | WO 01/006033 A1 | 2/2001 |
| WO | WO 01/14736 A1 | 3/2001 |
| WO | WO 01/14745 A1 | 3/2001 |
| WO | WO 01/26862 A1 | 4/2001 |
| WO | WO 01//37631 A2 | 5/2001 |
| WO | WO 01/40537 A1 | 6/2001 |
| WO | WO 01/47451 A1 | 7/2001 |
| WO | WO 01/59544 A2 | 8/2001 |
| WO | WO 01/61182 | 8/2001 |
| WO | WO 01/61719 A1 | 8/2001 |
| WO | WO 01/62372 A1 | 8/2001 |
| WO | WO 01/63639 A1 | 8/2001 |
| WO | WO 01/67834 A1 | 9/2001 |
| WO | WO 01/79583 A2 | 10/2001 |
| WO | WO 01/80224 A2 | 10/2001 |
| WO | WO 02/006875 A1 | 1/2002 |
| WO | WO 02/13188 A1 | 2/2002 |
| WO | WO 02/24601 A1 | 3/2002 |
| WO | WO 02/24603 A1 | 3/2002 |
| WO | WO 02/24970 A2 | 3/2002 |
| WO | WO 02/32625 A2 | 4/2002 |
| WO | WO 02/44440 A1 | 6/2002 |
| WO | WO 02/054454 A2 | 7/2002 |
| WO | WO 02/062714 A2 | 8/2002 |
| WO | WO 02/073021 A1 | 9/2002 |
| WO | WO 02/080996 A1 | 10/2002 |
| WO | WO 02/085237 A2 | 10/2002 |
| WO | WO 02/090461 A1 | 11/2002 |
| WO | WO 02/097289 A1 | 12/2002 |
| WO | WO 03/009978 A1 | 2/2003 |
| WO | WO 03/013990 A1 | 2/2003 |
| WO | WO 03/020329 A1 | 3/2003 |
| WO | WO 03/021731 A1 | 3/2003 |
| WO | WO 03/031543 A2 | 4/2003 |
| WO | WO 03/046508 A3 | 6/2003 |
| WO | WO 03/054876 A1 | 7/2003 |
| WO | WO 03/076309 A2 | 9/2003 |
| WO | WO 03/078679 A1 | 9/2003 |
| WO | WO 03/091758 A2 | 11/2003 |
| WO | WO 03/095009 A1 | 11/2003 |
| WO | WO 03/105134 A1 | 12/2003 |
| WO | WO 2004/001804 A2 | 12/2003 |
| WO | WO 2004/004998 A1 | 1/2004 |
| WO | WO 2004/019809 A2 | 3/2004 |
| WO | WO 2004/024206 A1 | 3/2004 |
| WO | WO 2004/026359 A1 | 4/2004 |
| WO | WO 2004/026500 A2 | 4/2004 |
| WO | WO 2004/036169 A1 | 4/2004 |
| WO | WO 2004/036292 A2 | 4/2004 |
| WO | WO 2004/038701 A2 | 5/2004 |
| WO | WO 2004/043631 A1 | 5/2004 |
| WO | WO 2004/048126 A2 | 6/2004 |
| WO | WO 2004/067466 A1 | 8/2004 |
| WO | WO 2004/068530 A1 | 8/2004 |
| WO | WO 2004/071670 A1 | 8/2004 |
| WO | WO 2004/072959 A2 | 8/2004 |
| WO | WO 2004/078424 A2 | 9/2004 |
| WO | WO 2004/084773 A1 | 10/2004 |
| WO | WO 2004/088113 A1 | 10/2004 |
| WO | WO 2005/010596 A2 | 2/2005 |
| WO | WO 2005/011744 A2 | 2/2005 |
| WO | WO 2005/014760 A1 | 2/2005 |
| WO | WO 2005/014882 A1 | 2/2005 |
| WO | WO 2005/016620 A2 | 2/2005 |
| WO | WO 2005/021851 A1 | 3/2005 |
| WO | WO 2005/025844 A1 | 3/2005 |
| WO | WO 2005/034791 A1 | 4/2005 |
| WO | WO 2005/037144 A2 | 4/2005 |
| WO | WO 2005/037985 A2 | 4/2005 |
| WO | WO 2005/040451 A1 | 5/2005 |
| WO | WO 2005/042064 A1 | 5/2005 |
| WO | WO 2005/047737 A1 | 5/2005 |

OTHER PUBLICATIONS

Japan Tribology Congress 1999 Proceedings, May 1999, pp. 11-12.

M. Kano et al., "The Effect of ZDDP and MODTC Additives on Friction Properties of DLC and Steel Cam Follower in Engine Oil", Abstracts of Papers from 2$^{nd}$ World Tribology Congress, Sep. 3-7, 2001, p. 342.

"Geometrical Product Specifications (GPS)—Surface texture: Profile method—Terms, definitions and surface texture parameters", Japanese Industrial Standard (JIS B 0601) Machine Elements, 2001, pp. 1-34.

"Petroleum products—Determination of base number—Perchloric acid potentiometric titration method", International Organization for Standardization (ISO 37771), Aug. 15, 1994, pp. 1-8.

"Standard Text Method for Separation of Representative Aromatics and Nonaromatics Fractions of High-Boiling Oils by Elution Chromatography", American Society for Testing and Materials (ASTM D 2549), 1995, pp. 895-900.

"High carbon chromium bearing steels", Japanese Industrial Standard (JIS G 4805), 1999, pp. 1-31, Japanese Standards Association, Tokyo, Japan.

"Carbon Steels for Machine Structural Use", Japanese Industrial Standard (JIS G 4051), 1979, pp. 1381-1383.

"Grey iron castings", Japanese Industrial Standard (JIS G 5501), pp. 2075-2077.

"Aluminum alloy castings", Japanese Industrial Standard (JIS H 5202), pp. 1637-1641.

Von Dr.-Ing et al., "Neuartige Laufflächen-Schutzverfahren für Kolben von Verbrennungsmotoren", VDI-Zeitschrift Bd., Apr. 18, 1942, pp. 245-247, vol. 86, No. 15-16.

Gåhlin, Rickard et al., "ME-C:H Coatings in Motor Vehicles," *Wear* 249, 2001, pp. 302-309.

Hershberger, J., et al., "Evaluation of DLC Coatings for Spark-Ignited, Direct-Injected Fuel Systems," *Surface & Coatings Technology*, 179, 2004, pp. 237-244.

Hershberger, J. et al., "Friction and Wear Behavior of Near-Frictionless Carbon Coatings in Formulated Gasolines," *Surface & Coating Technology*, 183, 2004, pp. 111-117.

Kovalchenko, A., et al., "Friction and Wear Performance of Low-Friction Carbon Coatings Under Oil Lubrication," Energy Technology Div., Argonne National Laboratory.

Ajayi, O., et al., "Effect of Carbon Coating on Scuffing Performance in Diesel Fuels," *Tribology Transactions*, vol. 44, 2001, pp. 298-304.

Ajayi, O., et al., Effect of Thin-Film Coating on Wear in EGR-Contaminated Oil, Energy Technology Div., Argonne National Laboratory.

Fujimori, N., et al., "Characterization of Conducting Diamond Films," *Vaccum*, vol. 36, Nos. 1-3, 1996, pp. 99-102.

Patent/Literature Search Report, Bawa Biotechnology Consulting, LLC, Jun. 3, 2005 (201 pages).

"Aluminium Alloy Die Castings," Japanese Industrial Standard (JIS H 5302), 2000, pp. 1-12.

"Aluminum Alloys Castings", Japanese Industrial Standard (JIS H 5202), 1999 (18 pages).

"Aluminum Alloy Die Castings," JIS H5302 (2000), pp. 1670-1681.

"Assessment of 2nd to 5th Order Irregularities of Surface Configuration by Means of Sections of Surfaces Definitions Relating to Reference System and Dimensions," DIN 4762, UDC 621-288:001.4 (Aug. 1960), pp. 1-4.

API Motor Oil Guide, Which Oil is Right for You, American Petroleum Institute, Copyright 2002.

"Carbon Steels for Machine Structural Use", Japanese Industrial Standard (JIS G 4051), 1979, pp. 1-10.

"Chromium Molybdenum Steels," Japanese Industrial Standard (JIS G 4105), 1979, pp. 1-11 (with Translation).

"Chromium Steels," Japanese Industrial Standard (JIS G 4104), 1979, pp. 1-9.

D.G. Watson et al., "Engineering Drawing Practice," XP002281300, University of Hertfordshire, Sep. 1991, p. 29, Figure 38.

Database WPI, Nov. 28, 2000, Derwent Publications, Ltd., AN 2000640583, XP002240184, JP 2000-327484, Nov. 28, 2000.

Dr. Marx, "Surfaces and Contact Mechanics", XP-002233233, Google, Retrieved from the internet, Mar. 3, 2003, pp. 1-18.

Engine Oil Viscosity Classification—SAE J300 revised Apr. 1997, p. 133.

"Geometrical Product Specifications (GPS)—Surface texture: Profile method—Terms, definitions and surface texture parameters", Japanese Industrial Standard (JIS B 0601) Machine Elements, 2003, pp. 6, 7, 263-287, and 2586.

International Standard "Application of Carbides for Machining by Chip Removal—Designation of the Main Groups of Chip Removal and Groups of Application," ISO 513, (1975), pp. 67-69.

Japanese Industrial Standard, "Structural Steels with Specified Hardenability Bands", JIS G 4052, 1979, pp. 2414, 2415, 1390-1403, 1410 and 1411.

JIS Japanese Industrial Standard; "Surface Roughness—Definitions and Designation"; JIS B 0601; 1994. (w/Translation).

JIS Japanese Industrial Standard; "Vickers Hardness Test—Test Method"; JIS Z 2244; 1998; (w/Translation).

K. Holmberg et al., "Tribological Characteristics of Diamond-like Carbon Coatings," VTT Symposium, Technical Research Centre of Finland, XP000570636, 1994, pp. 24-238.

Patent Abstracts of Japan, vol. 1996, No. 09, Sep. 30, 1996, JP 08-128448, May 21, 1996.

Patent Abstracts of Japan, vol. 2000, No. 01, Jan. 31, 2000, JP 11-287329, Oct. 19, 1999.

Patent Abstracts of Japan, vol. 2000, No. 09, Oct. 13, 2000, JP 2000-170768, Jun. 20, 2000.

PCT/IB2004/002552.

"Stainless Steel Bars", Japanese Industrial Standard (JIS G 4303), pp. 1457-1477.

"Standard Practice for Codification of Certain Nonferrous Metals and Alloys, Cast and Wrought1", ASTM International, Designation: B 275-02, Jun. 2002, pp. 1-7.

"Standard Test Method for Calibration and Operation of the Fatex Block-on-Ring Friction and Wear Testing Machine", ASTM Designation: D2714—88, Jan. 1989, pp. 383-386.

Steve J. Bull et al., "High-Performance Diamond and Diamond-like Coatings", JOM, Apr. 1995, pp. 16-19, vol. 47, No. 4, XP 000500980.

Patent Abstracts of Japan, vol. 2003, No. 12, Dec. 5, 2003, JP 2004-155891, Jun. 3, 2004.

U.S. Appl. No. 10/911,741, Ueno, filed May 5, 2004.

Ronkainen, Helena, "Tribological Properties of Hydrogenated and Hydrogen-Free Diamond-Like Carbon Coatings," Disseration for the Degree of Doctor of Science in Technology, VTT Publications No. 434.

* cited by examiner

FIG.3A
FIG.3B
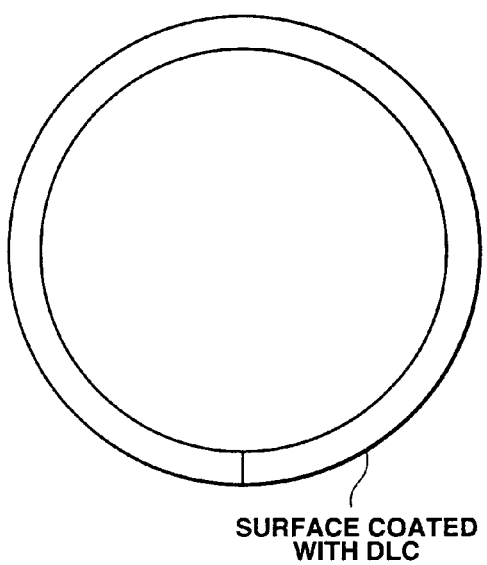
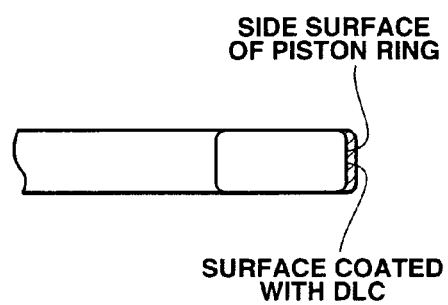
SIDE SURFACE
OF PISTON RING
SURFACE COATED
WITH DLC
SURFACE COATED
WITH DLC
FIG.4A
FIG.4B
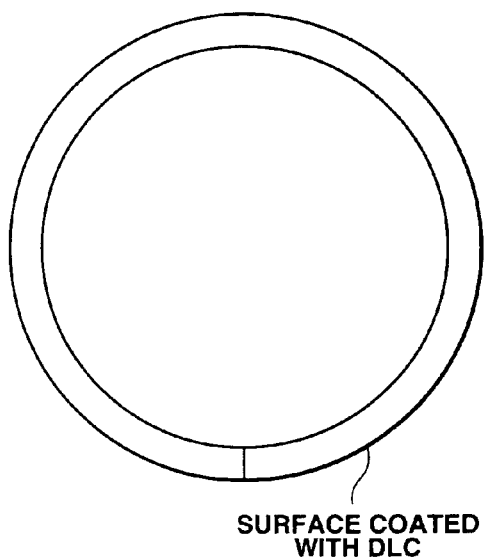
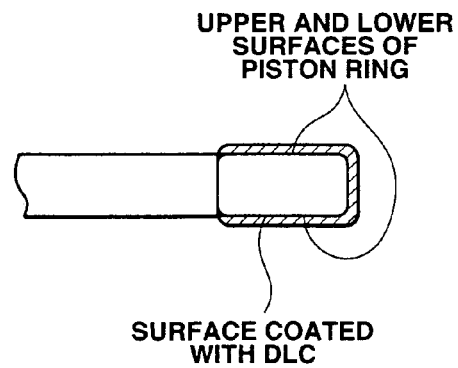
UPPER AND LOWER
SURFACES OF
PISTON RING
SURFACE COATED
WITH DLC
SURFACE COATED
WITH DLC

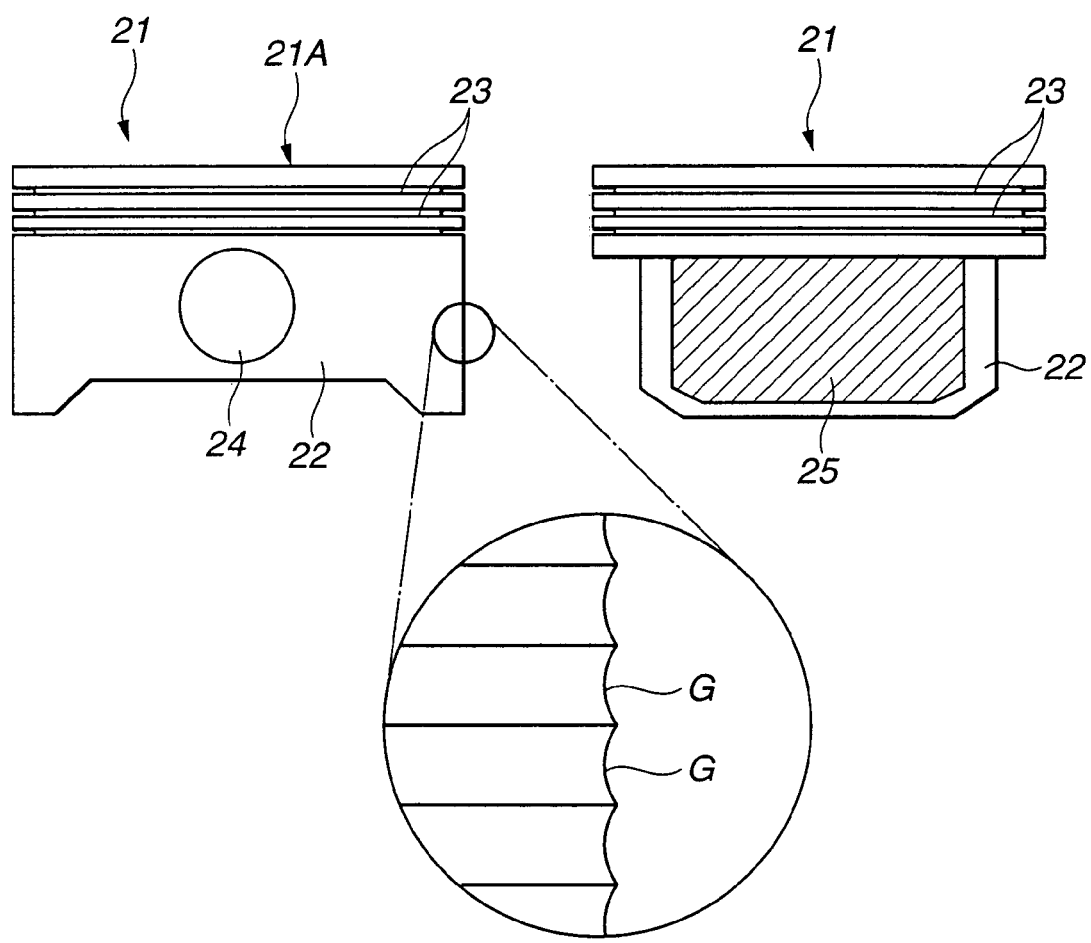

PISTON FOR INTERNAL COMBUSTION ENGINE

CROSS-REFERENCE TO RELATED APPLICATIONS

This application has the following related applications: U.S. patent application Ser. Nos. 09/545,181 based on Japanese Patent Application Hei-11-102205 filed Apr. 9, 1999; Ser. No. 10/468,713 which is the designated state (United States) application number of PCT Application JP02/10057 based on Japanese Patent Application 2001-117680 filed Apr. 17, 2001; Ser. No. 10/355,099 based on Japanese Patent Application 2002-45576 filed Feb. 22, 2002; Ser. No. 10/682,559 based on Japanese Patent Application No. 2002-302205 filed Oct. 16, 2002; and Ser. No. 10/692,853 based on Japanese Patent Application 2002-322322 filed Oct. 16, 2002.

BACKGROUND OF THE INVENTION

This invention relates to improvements in a piston for an internal combustion engine, more particularly to a piston whose sliding section is coated with a hard carbon thin film such as a diamond-like carbon thin film which exhibits a highly excellent low friction characteristics particularly in presence of a specified lubricating oil (composition).

Global environmental problems such as global warming and ozone layer destruction are coming to the fore. As it has been said that the global warming is significantly affected by $CO_2$ emission, the reduction of $CO_2$ emission, notably the setting of $CO_2$ emission standards, has become a big concern to each country. One of challenges to reduce $CO_2$ emission is to improve vehicle fuel efficiency that depends on the performance of engine sliding members and a lubricating oil applied thereto. There are the following approaches to improving vehicle fuel efficiency: (1) lowering the viscosity of the lubricating oil, thereby reducing viscous resistance in hydrodynamic lubrication regions and agitation resistance in the engine; and (2) to adding a suitable friction modifier and other additives into the lubricating oil so as to reduce friction losses under the conditions of mixed lubrication and boundary lubrication.

In view of the foregoing, many studies have been made on various friction modifiers including organomolybdenum compounds, such as molybdenum ditiocarbamate (MoDTC) and molybdenum dithiophosphate (MoDTP). As a result of the studies, it has been found that the lubricating oil containing an organomolybdenum compound successfully produces a friction reducing effect on the steel sliding members in the early stages of use.

SUMMARY OF THE INVENTION

Heretofore, the application of hard coating materials to the engine sliding members has been also examined so that the sliding members can attain high abrasion resistance and a low friction coefficient. Above all, a diamond-like carbon (DLC) material is known for its low-friction performance in the air and therefore expected to be useful as a coating material for the sliding members.

However, the DLC material does not provide a low friction coefficient in the presence of a lubricating oil, as disclosed in Japan Tribology Congress 1999. 5, Tokyo, Proceeding Page 11-12, KANO et al. Even when used in combination with the lubricating oil containing an organomolybdenum compound, the DLC material cannot provide a sufficiently low friction coefficient, as disclosed in World Tribology Congress 2001. 9, Vienna, Proceeding Page 342, KANO et al.

It is therefore an object of the present invention to provide an improved piston for an internal combustion engine, by which drawbacks encountered in conventional pistons can be effectively overcome.

Another object of the present invention is to provide an improved piston for an internal combustion engine, which can exhibit a highly excellent low friction characteristics even in presence of a lubricating oil, and an excellent fuel economy effect as compared with a conventional piston used in presence of a lubricating oil containing organomolybdenum compound.

A further object of the present invention is to provide an improved piston for an internal combustion engine, which exhibits a highly excellent low friction characteristics particularly in presence of or combination of a specified lubricating oil (composition) upon being coated with a specified hard carbon tin film.

A first aspect of the present invention resides in a piston for an internal combustion engine. The piston comprises a sliding part having a sliding section which is in slidable contact with an opposite member in presence of a lubricating oil. Additionally, a hard carbon thin film is coated on the sliding section of the sliding part. Here, the lubricating oil contains at least one selected from the group consisting of ashless fatty acid ester friction modifier, ashless aliphatic amine friction modifier, polybutenyl succinimide, derivative of polybutenyl succinimide, zinc dithiophosphate, and derivative of zinc dithiophosphate.

A second aspect of the present invention resides in an internal combustion engine which comprises a cylinder block having a cylinder bore section formed of eutectic or hypereutectic aluminum alloy. A sliding part has a sliding section which is in slidable contact with the cylinder bore section in presence of a lubricating oil. Additionally, a hard carbon thin film is coated on the sliding section of the sliding part and contains hydrogen atom in an amount of not more than 1 atomic %.

A third aspect of the present invention resides in a piston ring of a piston for an internal combustion engine. The piston ring comprises a sliding section having a sliding surface which is in slidable contact with an opposite member in presence of a lubricating oil. Additionally, a hard carbon thin film is coated on the sliding surface of the sliding section and contains hydrogen atom in an amount of not more than 25 atomic %.

A fourth aspect of the present invention resides in a piston for an internal combustion engine. The piston comprises a piston main body section having a piston skirt section. The piston skirt section has a sliding surface at which streak-like grooves are formed having a pitch ranging from 15 to 30 µm and a depth ranging from 5 to 15 µm. The sliding surface is in slidable contact with a cylinder bore section of a cylinder block in presence of a lubricating oil. Additionally, a hard carbon thin film is coated on the sliding surface of the piston skirt section.

A fifth aspect of the present invention resides in a sliding member which comprises a main body section formed of a material selected from a group consisting of steel and aluminum-based alloy. The main body section is in slidable contact with an opposite member in presence of a lubricating oil. A hard carbon thin film is coated on a surface of the main body section. Additionally, an intermediate layer is formed between the main body section and the hard carbon thin film. The intermediate layer is formed of a material selected from group consisting of rubber and synthetic resin.

BRIEF DESCRIPTION OF THE DRAWINGS

FIG. 3A is a plan view of an example of a piston ring according to a second embodiment of the present invention;

FIG. 3B is a fragmentary sectional view of the piston ring of FIG. 3A;

FIG. 4A is a plan view of another example of the piston ring according to the second embodiment of the present invention;

FIG. 4B is a fragmentary sectional view of the piston ring of FIG. 4A;

FIG. 5A is a front view of a piston according to a third embodiment of the present invention, provided with a partly enlarged view;

FIG. 5B is a side view of the piston of FIG. 5A;

DESCRIPTION OF THE EMBODIMENTS

The present invention will be discussed below in detail. In the following description, all percentages (%) are by mass unless otherwise specified.

First Embodiment

A first embodiment of a piston for an internal combustion engine, according to the present invention will be discussed with reference to FIGS. 1 and 2.

Figure 1:
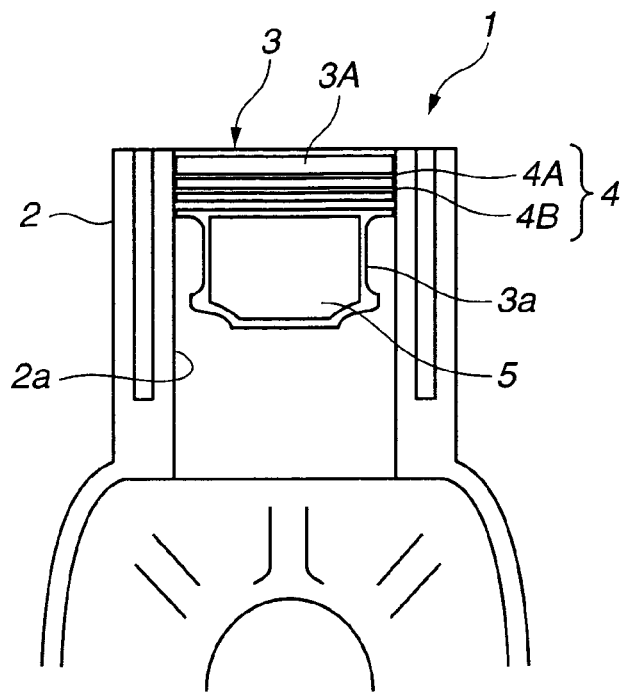
FIG. 1 is a fragmentary schematic sectional view of an essential part of an internal combustion engine, including a first embodiment of a piston according to the present invention.

Referring now to FIG. 1, an internal combustion engine for an automotive vehicle is illustrated by reference numeral 1. Engine 1 includes cylinder block 2 formed of eutectic or hyper-eutectic aluminum alloy. Cylinder block 2 is formed with cylinder bore section 2a. Piston 3 according to the present invention is movably disposed in cylinder bore section 2a in such a manner as to make its reciprocating motion. Piston 3 includes main body section 3A formed of a base material such as iron-based material (steel) or aluminum-based material (aluminum alloy), and formed with two piston ring grooves (not identified). Piston rings 4 (top ring 4A and oil ring 4B) are respectively fitted in the piston ring grooves of main body section 3A. Piston main body section 3A is an integral one-piece member including piston skirt section 3a. The piston rings serve as a sliding part or member. Each of piston rings 4 has a sliding section (not identified) which is in slidable contact with the wall surface of cylinder bore section 2a (as an opposite member) and coated with hard carbon tin film 5 though not identified. Piston skirt section 3a has a sliding section (not identified) which is in slidable contact with the wall surface of cylinder bore section 2a (as the opposite member) and coated with hard carbon thin film 5. It will be understood that lubricating oil is present between the sliding section of each of piston rings 4 or of piston skirt section 3a and the wall surface of cylinder bore section 2a so that the sliding section of each of piston ring 4 or of piston skirt 3a is in slidable contact with the wall surface of cylinder bore section 2a.

In this embodiment, hard carbon thin film 5 is preferably a DLC (diamond-like carbon) thin film which is formed by a variety of PVD processes, more specifically an arc ion plating process. This DLC thin film is formed mainly of carbon atom and amorphous. More specifically, the DLC thin film is formed of hydrogen-free amorphous carbon (a-C) that consists of carbon, hydrogen-containing amorphous carbon (a-C: H), or metal carbide or metal carbon (MeC) that contains as a part a metal element of titanium (Ti) or Molybdenum (Mo). For a significant reduction in friction, the DLC thin film is preferably not more than 1 atomic %, more preferably not more than 0.5 atomic %, and preferably formed of hydrogen-free amorphous carbon (a-C).

The sliding section of piston main body section 3A is formed of the base material such as iron-based material (steel) or aluminum-based material (aluminum alloy) and preferably has a surface roughness Ra of not more than 0.03 μm in a condition where the sliding section which has not yet been coated with the hard carbon thin film. If the surface roughness of the sliding section exceeds 0.03 μm, projecting portions due to the surface roughness of the hard carbon thin film increases a local Hertz's contact pressure to the opposite member to increase, thereby resulting in induction of formation of crack in the hard carbon thin film. The surface roughness Ra is explained as $R_{a75}$ in JIS (Japanese Industrial Standard) B 0601 (:2001).

The lubricating oil (composition) includes a base oil and at least one of an ashless fatty acid ester (ester of fatty acid) friction modifier and an ashless aliphatic amine friction modifier. In other words, the ashless fatty acid ester function modifier and/or aliphatic amine friction modifier are/is contained in the base oil. The base oil is not particularly limited and can be any base oil (compound or compounds) commonly used for a lubricating oil, such as a mineral oil, a synthetic oil, an oil and fat (compound), or any combination of the mineral oil, the synthetic oil and the oil and fat.

Specific examples of the mineral oil include paraffin-based or naphthene-based oil, and n-paraffin, prepared by extracting a lubricating oil fraction from petroleum by atmospheric or reduced-pressure distillation, and then, purifying the obtained lubricating oil fraction by using at least one of the following treatments: solvent deasphalting, solvent extraction, hydrogenolysis, solvent dewaxing, hydrogenation purification, sulfuric acid treatment, clay treatment and the like which may be used in suitable combination. It is general to purify the obtained lubricating oil fraction by using hydrogenation purification or solvent purification. Additionally, it is preferable to use the mineral oil which is obtained by purifying the lubricating oil fraction using high-hydrogenolysis process which is capable of largely decreasing aromatic components, or the mineral oil produced by a process for isomerizing GTL (gas to liquid) Wax.

Specific examples of the synthetic oil include: poly-α-olefins (such as 1-octene oligomer, 1-decene oligomer and ethylene-propylene oligomer), hydrides of poly-α-olefins, isobutene oligomers, hydrides of isobutene oligomers, isoparaffins, alkylbenzenes, alkylnaphthalenes, diesters (such as ditridecyl glutarate, dioctyl adipate, diisodecyl adipate, ditridecyl adipate and dioctyl sebacate), polyol esters (such as trimethylolpropane caprylate; trimetylolpropane pelargonate; trimethylolpropane ester such as trimethylolpropane isostearinate; pentaerythritol ester such as pentaerythritol-2-ethyl hexanoate and pentaerythritol pelargonate), polyoxyalkylene glycol, dialkyldiphenyl ether, and polyphenyl ether. Among these synthetic oil compounds, preferred are poly-α-olefins, such as 1-octene oligomer and 1-decene oligomer and hydrides thereof.

The above-mentioned mineral and synthetic oil (compounds) may be used alone, or in the form of a mixture of any two or more thereof with no limitation on the mixture ratio.

The sulfur content of the base oil is not particularly restricted. The sulfur content is preferably not more than 0.2%, more preferably not more than 0.1%, much more preferably not more than 0.05%. Additionally, it is preferable to use, as the base oil, mineral oil which is purified by hydrogenation or synthetic oil because such oil has a sulfur content of not more than 0.005% or substantially no sulfur content (not more than 5 ppm).

The aromatic content of the base oil is also not particularly restricted. The aromatic content of the base oil is preferably 15% or less, more preferably 10% or less, and most preferably 5% or less in order that the lubricating oil for internal combustion engines maintain its low friction characteristics for a long time. When the aromatic content exceeds 15%, the base oil undesirably deteriorates in oxidation stability. Herein, the aromatic content is defined as the amount of aromatics fractions determined according to ASTM D2549 "Standard Test Method for Separation of Representative Aromatics and Non-aromatics Fractions of High-Boiling Oils by Elution Chromatography".

The kinematic viscosity of the base oil is not particularly restricted. When the lubricating oil is used for an internal combustion engine, the kinematic viscosity of the base oil is preferably 2 mm$^2$/s or higher, more preferably 3 mm$^2$/s and, at the same time, is preferably 20 mm$^2$/s or lower, more preferably 10 mm$^2$/s or lower, most preferably 8 mm$^2$/s or lower, as measured at 100° C. When the kinematic viscosity is lower than 2 mm$^2$/s at 100° C., the lubricating oil can provide a sufficient wear resistance and be inferior in vaporization characteristics. When the kinematic viscosity exceeds 20 mm$^2$/s, the lubricating oil is difficult to exhibit a low frictional characteristics and may be degraded in vaporization characteristics, which are not preferable. In connection with the present invention, at least two base oils may be freely selected to be mixed to form a mixture, in which the kenematic viscosity of the single base oil may be out of the above-mentioned range as far as the kinematic viscosity of the mixture at 100° C. falls within the above-mentioned preferable range.

The viscosity index of the base oil is not particularly restricted, and is preferably 80 or higher, more preferably 100 or higher, most preferably 120 or higher, when the lubricating oil is used for an internal combustion engine. Increasing the viscosity index of the base oil can provide the lubricating oil for the internal combustion engine, excellent in low temperature viscosity characteristics and fuel economy performance.

Examples of the fatty acid ester friction modifier and the aliphatic amine friction modifier are an fatty acid ester and an aliphatic amine each having $C_6$-$C_{30}$ straight or branched hydrocarbon chains or groups, preferably $C_8$-$C_{24}$ straight or branched hydrocarbon chains, more preferably $C_{10}$-$C_{20}$ straight or branched hydrocarbon chains. When the carbon number of the hydrocarbon chain is not within the range of 6 to 30, there arises a possibility that the lubricating oil may not produce a sufficient friction reducing effect as expected. It will be understood that a suitable mixture of fatty acid ester and the aliphatic amine may be used.

Specific examples of the $C_6$-$C_{30}$ straight or branched hydrocarbon chain include: alkyl groups, such as hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl, tetracosyl, pentacosyl, hexacosyl, heptacosyl, octacosyl, nonacosyl and triacontyl; and alkenyl groups, such as hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl, icosenyl, heneicosenyl, docosenyl, tricosenyl, tetracosenyl, pentacosenyl, hexacosenyl, heptacosenyl, octacosenyl, nonacosenyl and triacontenyl. The above alkyl and alkenyl groups include all possible isomers. Additionally, the position of alkenyl groups is free.

The fatty acid ester can be exemplified by esters of fatty acids having the above $C_6$-$C_{30}$ hydrocarbon groups or chains and monohydric or polyhydric aliphatic alcohols. Specific examples of such fatty acid esters include glycerol monooleate, glycerol dioleate, sorbitan monoleate and sorbitan dioleate.

The aliphatic amine can be exemplified by aliphatic monoamines and alkylene oxide adducts thereof, aliphatic polyamines, imidazoline compounds, and derivatives thereof. Specific examples of such aliphatic amines include: aliphatic amine compounds, such as laurylamine, lauryldiethylamine, lauryldiethanolamine, dodecylcdipropanolamine, palmitylamine, stearylamine, stearyltetraethylenepentamine, oleylamine, oleylpropylenediamine, oleyldiethanolamine and N-hydroxyethyloleylimidazolyne; adducts of the above aliphatic amines ($C_6$-$C_{28}$ alkyl or alkenyl amines) with alkylene oxides, such as N,N-dipolyoxyalkylene-N-alkylamines; and acid-modified compounds prepared by reacting the above aliphatic amines with $C_2$-$C_{30}$ monocarboxylic acids (such as fatty acids) or $C_2$-$C_{30}$ polycarboxylic acids (such as oxalic acid, phthalic acid, trimellitic acid and pyromellitic acid) so as to neutralize or amidate the whole or part of the remaining amino and/or imino groups. In connection with the present invention, N,N-dipolyoxyethylene-N-oleylamine is preferably used.

The amount of the fatty acid ester friction modifier and/or the aliphatic amine friction modifier added in the lubricating oil is not particularly restricted, and is preferably 0.05 to 3.0%, more preferably 0.1 to 2.0%, and most preferably 0.5 to 1.4%, based on the total mass of the lubricating oil. When the amount of the fatty acid ester friction modifier and/or the aliphatic amine friction modifier is less than 0.05%, there arises a possibility that the lubricating oil may not produce a sufficient friction reducing effect. When the amount of the fatty acid ester friction modifier and/or the aliphatic amine friction modifier exceeds 3.0%, the lubricating oil produce a good friction reducing effect but undesirably deteriorates in storage stability and compatibility to cause precipitations.

Further, the lubricating oil preferably includes polybutenyl succinimide and/or a derivative thereof as an ashless dispersant. Specific examples of the polybutenyl succinimide usable in connection with the present invention include compounds represented by the following general formulas (1) and (2).

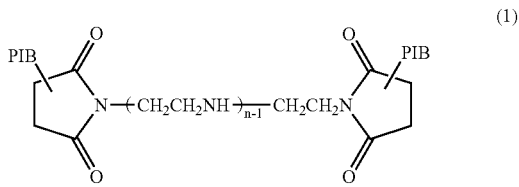

(1)

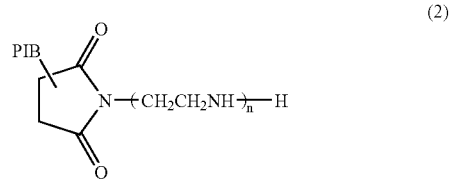

(2)

In each of the formulas (1) and (2), n represents an integer of 1 to 5, preferably 2 to 4, so as to attain a good detergent effect. Further, PIB represents a polybutenyl group derived from polybutene. The polybutene can be prepared by polymerizing high-purity isobutene or a mixture of 1-butene and isobutene in the presence of a boron fluoride catalyst or an aluminum chloride catalyst in such a manner that the polybutene attains a number-average molecular weight of 900 to 3,500, preferably 1,000 to 2,000. When the number-average molecular weight of the polybutene is less 900, there is a possibility of failing to attain a sufficient detergent effect. When the number-average molecular weight of the polybutene exceeds 3,500, the polybutene may undesirably deteriorate in low-temperature fluidity. In the production of the polybutenyl succinimide, the polybutene may be used after purified by removing trace amounts of fluorine and chlorine residues, which result from the above polybutene production catalyst, by any suitable treatment (such as adsorption process or washing process). The amount of the fluorine and chlorine residues is preferably controlled to 50 ppm or less, more preferably 10 ppm or less, most preferably 1 ppm or less.

The production method of the polybutenyl succinimide is not particularly restricted. For example, the polybutenyl succinimide can be prepared by reacting an chloride of the above-mentioned polybutene, or the polybutene from which fluorine and chlorine residues are removed, with maleic anhydride at 100 to 200° C. to form polybutenyl succinate, and then, reacting the thus-formed polybutenyl succinate with polyamine (such as diethylene triamine, triethylene tetramine, tetraethylene pentamine or pentaethylene hexamine).

The polybutenyl succinimide derivative can be exemplified by boron- and acid-modified compounds obtained by reacting the polybutenyl succinimide of the formulas (1) and (2) with boron compounds or oxygen-containing organic compounds so as to neutralize or amidate the whole or part of the remaining amino and/or imide groups. Among these, boron-containing polybutenyl succinimide, especially boron-containing bis(polybutenyl)succinimide, is preferably used.

The above boron compound can be a boric acid, a borate or a boric acid ester. Specific examples of the boric acid include orthoboric acid, metaboric acid and paraboric acid. Specific examples of the borate include: ammonium salts including ammonium borates, such as ammonium metaborate, ammonium tetraborate, ammonium pentaborate and ammonium octaborate. Specific examples of the boric acid ester include: esters of boric acids and alkylalcohols (preferably $C_1$-$C_6$ alkylalcohols), such as monomethyl borate, dimethyl borate, trimethyl borate, monoethyl borate, diethyl borate, triethyl borate, monopropyl borate, dipropyl borate, tripropyl borate, monobutyl borate, dibutyl borate and tributyl borate. Herein, the content ratio of nitrogen to boron (B/N) by mass in the boron-containing polybutenyl succinimide is usually 0.1 to 3, preferably 0.2 to 1.

The above oxygen-containing organic compound can be exemplified by: $C_1$-$C_{30}$ monocarboxylic acids, such as formic acid, acetic acid, glycolic acid, propionic acid, lactic acid, butyric acid, valeric acid, caproic acid, enanthic acid, caprylic acid, pelargonic acid, capric acid, undecylic acid, lauric acid, tridecanoic acid, myristic acid, pentadecanoic acid, palmitic acid, margaric acid, stearic acid, oleic acid, nonadecanoic acid and eicosanoic acid; $C_2$-$C_{30}$ polycarboxylic acids, such as oxalic acid, phthalic acid, trimellitic acid and pyromellitic acid, and anhydrides and esters thereof; $C_2$-$C_6$ alkylene oxides; and hydroxy(poly)oxyalkylene carbonates.

The amount of the polybutenyl succinimide and/or the derivative thereof added in the lubricating oil is not particularly restricted, and is preferably 0.1 to 15%, more preferably 1.0 to 12%, based on the total mass of the lubricating oil. When the amount of the polybutenyl succinimide and/or the derivative thereof is less than 0.1%, there arises a possibility of failing to attain a sufficient detergent effect. It becomes uneconomical when the amount of the polybutenyl succinimide and/or the derivative thereof exceeds 15%. In addition, such a large amount of the polybutenyl succinimide and/or the derivative thereof tends to cause a deterioration in demulsification ability.

Furthermore, the lubricating oil preferably includes zinc dithiophosphate represented by the following general formula (3) as an antioxidant and as an anti-wear agent.

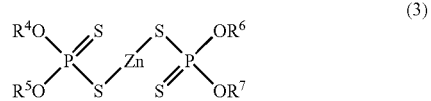

(3)

In the general formula (3), $R^4$, $R^5$, $R^6$ and $R^7$ each represent $C_1$-$C_{24}$ hydrocarbon groups. The $C_1$-$C_{24}$ hydrocarbon group is preferably a $C_1$-$C_{24}$ straight-chain or branched-chain alkyl group, a $C_3$-$C_{24}$ straight-chain or branched-chain alkenyl group, a $C_5$-$C_{13}$ cycloalkyl or straight-chain or branched-chain alkylcycloalkyl group, a $C_6$-$C_{18}$ aryl or straight-chain or branched-chain alkylaryl group, or a $C_7$-$C_{19}$ arylalkyl group. The above alkyl group or alkenyl group can be primary, secondary or tertiary. Specific examples of $R^4$, $R^5$, $R^6$ and $R^7$ include: alkyl groups, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl and tetracosyl; alkenyl groups, such as propenyl, isopropenyl, butenyl, butadienyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl (oleyl), nonadecenyl, icosenyl, heneicosenyl, docosenyl, tricosenyl and tetracosenyl; cycloalkyl groups, such as cyclopentyl, cyclohexyl and cycloheptyl; alkylcycloalkyl groups, such as methylcyclopentyl, dimethylcyclopentyl, ethylcyclopentyl, propylcyclopentyl, ethylmethylcyclopentyl, trimethylcyclopentyl, diethylcyclopentyl, ethyldimethylcyclopentyl, propylmethylcyclopentyl, propylethylcyclopentyl, di-propylcyclopentyl, propylethylmethylcyclopentyl, methylcyclohexyl, dimethylcyclohexyl, ethylcyclohexyl, propylcyclohexyl, ethylmethylcyclohexyl, trimethylcyclohexyl, diethylcyclohexyl, ethyldimethylcyclohexyl, propylmethylcyclohexyl, propylethylcyclohexyl, di-propylcyclohexyl, propylethylmethylcyclohexyl, methylcycloheptyl, dimethylcycloheptyl, ethylcycloheptyl, propylcycloheptyl, ethylmethylcycloheptyl, trimethylcycloheptyl, diethylcycloheptyl, ethyldimethylcycloheptyl, propylmethylcycloheptyl, propylethylcycloheptyl, di-propylcycloheptyl and propylethylmethylcycloheptyl; aryl groups, such as phenyl and naphthyl; alkylaryl groups, such as tolyl, xylyl, ethylphenyl, propylphenyl, ethylmethylphenyl, trimethylphenyl, butylphenyl, propylmethylphenyl, diethylphenyl, ethyldimethylphenyl, tetramethylphenyl, pentylphenyl, hexylphenyl, heptylphenyl, octylphenyl, nonylphenyl, decylphenyl, undecylphenyl and dodecylphenyl; and arylalkyl groups, such as benzyl, methylbenzyl, dimethylbenzyl, phenethyl, methylphenethyl and dimethylphenethyl. The above hydrocarbon groups include all possible isomers.

The above-mentioned hydrocarbon groups formable with $R^4$, $R^5$, $R^6$ and $R^7$ include all considerable straight or branched chain structures. The position of double bond of alkenyl group, the bonding position of alkyl group to cycloalkyl group and the bonding position of alkyl group to aryl group are free. Among the above-mentioned hydrocarbon groups, especially preferable ones are straight or branched alkyl groups having a carbon number ranging from 1 to 18, aryl groups having a carbon number ranging from 6 to 18, and straight or branched alkylaryl groups.

Specific examples of the zinc dithiophosphate usable in connection with the present invention include zinc diisopropyldithiophosphate, zinc diisobutyldithiophosphate, zinc di-sec-butyldithiophosphate, zinc di-sec-pentyldithiophospbate, zinc di-n-hexyldithiophosphate, zinc di-sec-hexyldithiophosphate, zinc di-octyldithiophosphate, zinc di-2-ethylhexyldithiophosphate, zinc di-n-decyldithiophosphate, zinc di-n-dodecyldithiophosphate, zinc diisotridecyldithiophosphate and mixtures thereof.

The amount of the zinc dithiophosphate added in the lubricating oil is not particularly restricted. The zinc dithiophosphate is preferably contained in an amount of 0.1% or less, more preferably in an amount of 0.06% or less, most preferably in a minimum effective amount, in terms of the phosphorus element based on the total mass of the lubricating oil in order to produce a higher friction reducing effect. When the amount of the zinc dithiophosphate exceeds 0.1%, there arises a possibility of inhibiting the effect of the ashless fatty acid ester friction modifier and/or the ashless aliphatic amine friction modifier, particularly at a sliding surface (plane) between the DLC thin film and the opposite member formed of iron-based material.

The zinc dithiophosphate can be prepared by any known method. For example, the zinc dithiophosphate may be prepared by reacting alcohols or phenols having the above $R^4$, $R^5$, $R^6$ and $R^7$ hydrocarbon groups with phosphorous pentasulfide to form dithiophosphoric acid, and then, neutralizing the thus-formed dithiophosphoric acid with zinc oxide. Herein, the molecular structure of zinc dithiophosphate differs according to the alcohols or phenols used as a raw material for the zinc dithiophosphate production. It will be understood that at least two kinds of zinc dithiophosphates represented by the above general formula (3) may be mixed at suitable ratio so as to be used.

As discussed above, in connection with the present invention, the lubricating oil can exhibit an extremely excellent low friction characteristics in automotive internal combustion engines in case of being used between the sliding surface of the sliding part of the piston and the opposite member (such as the wall surface of the cylinder bore section), in which the sliding section of the sliding part of the piston is coated with the hard carbon thin film. In order to raise performances required for the lubricating oil (composition) of internal combustion engines, the lubricating oil may contain other additives, such as a metallic detergent, an antioxidant, a viscosity index improver, a friction modifier other than the above-mentioned fatty acid ester friction modifier and/or the aliphatic amine friction modifier, an ashless dispersant other than the above-mentioned polybutenyl succinimide and/or the derivative thereof, an anti-wear agent or extreme-pressure additive, a rust inhibitor, a nonionic surfactant, a deemulsifier, a metal deactivator and/or an anti-foaming agent, when used in an internal combustion engine. These additives may be used alone or in the form of a mixture of two or more thereof so as to meet the lubricating oil performance required.

The metallic detergent can be any metallic-detergent compound commonly used for a lubricating oil. Specific examples of the metallic detergent usable in connection with the present invention include sulfonates, phenates and salicylates of alkali metals or alkali-earth metals; and mixtures of two or more thereof. Examples of the alkali metals include sodium (Na) and potassium (K), and examples of the alkali-earth metals include calcium (Ca) and magnesium (Mg). In connection with the present invention, sodium and calcium sulfonates, sodium and calcium phenates, and sodium and calcium salicylates are suitably used. The total base number and amount of the metallic detergent can be selected in accordance with the lubricating oil performance required. The total base number of the metallic detergent is usually 0 to 500 mgKOH/g, preferably 150 to 400 mgKOH/g, as measured by perchloric acid method according to ISO 3771 "Determination of base number—Perchloric acid potentiometric titration method". The amount of the metallic detergent is usually 0.1 to 10% based on the total mass of the lubricating oil.

The antioxidant can be any antioxidant compound commonly used for a lubricating oil. Specific examples of the antioxidant usable in connection with the present invention include: phenolic antioxidants, such as 4,4'-methylenebis(2,6-di-tert-butylphenol) and octadecyl-3-(3,5-di-tert-butyl-4-hydroxyphenyl)propionate; amino antioxidants, such as phenyl-α-naphthylamine, alkylphenyl-α-naphthylamine and alkyldiphenylamine; and mixtures of two or more thereof. The amount of the antioxidant is usually 0.01 to 5% based on the total mass of the lubricating oil.

The viscosity index improver can be exemplified by:

non-dispersion type viscosity index improvers, such as copolymers of one or two monomers selected from various methacrylic acids, and hydrides of the copolymers; and dispersion type viscosity index improvers, such as copolymers of methacrylates (including nitrogen compounds). There may be also used, as the viscosity index improver, copolymers of ethylene and α-olefins (such as propylene, 1-butene and 1-pentene) and hydrides thereof, polyisobutylenes and hydrides thereof, a hydrogenated copolymer of styrene and diene, a copolymer of styrene and maleic anhydride and polyalkylstyrenes. The molecular weight of the viscosity index improver needs to be selected in view of shear stability. For example, the number-average molecular weight of the viscosity index improver is desirably in a range of 5,000 to 1,000,000, more desirably 100,000 to 800,000, for dispersion or non-dispersion type polymethacrylates; in a range of 800 to 5,000 for polyisobutylenes and hydrides thereof; and in a range of 800 to 300,000, more desirably 10,000 to 200,000 for ethylene/α-olefin copolymers and hydrides thereof. The above viscosity index improving compounds can be used alone or in the form of a mixture of two or more thereof. The amount of the viscosity index improver is preferably 0.1 to 40.0% based on the total mass of the lubricating oil.

The friction modifier other than the above-mentioned fatty acid ester friction modifier and/or the aliphatic amine friction modifier can be exemplified by ashless friction modifiers, such as boric acid esters, higher alcohols and aliphatic ethers, and metallic friction modifiers, such as molybdenum dithiophosphate, molybdenum dithiocarbamate and molybdenum disulfide.

The ashless dispersant other than the above-mentioned polybutenyl succinimide and/or the derivative thereof can be exemplified by polybutenylbenzylamines and polybutenylamines each having polybutenyl groups of number-average molecular weight of 900 to 3,500, polybutenyl succinimides having polybutenyl groups of number-average molecular weight of less than 900 and derivatives thereof.

The anti-friction agent or extreme-pressure additive can be exemplified by disulfides, sulfurized fats and oils, olefin sulfides, phosphate esters having one to three $C_2$-$C_{20}$ hydrocarbon groups, thiophosphate esters, phosphite esters, thiophosphite esters and amine salts of these esters.

The rust inhibitor can be exemplified by alkylbenzene sulfonates, dinonylnaphthalene sulfonates, esters of alkenylsuccinic acids and esters of polyhydric alcohols.

The nonionic surfactant and the deemulsifier can be exemplified by noionic polyalkylene glycol surfactants, such as polyoxyethylene allkylethers, polyoxyethylene alkylphenyleters and polyoxyethylene alkylnaphthyleters.

The metal deactivator can be exemplified by imidazoline compounds, pyrimidine derivatives, thiazole and benzotriazole.

The anti-foaming agent can be exemplified by silicones, fluorosilicones and fluoroalkylethers.

Each of the friction modifier other than the fatty acid ester function modifier and/or the aliphatic amine function modifier, the ashless dispersant other than the polybutenyl succinimide and/or the derivative thereof, the anti-wear agent or extreme-pressure additive, the rust inhibitor and the demulsifier is usually contained in an amount of 0.01 to 5% based on the total mass of the lubricating oil, and the metal deactivator is contained in an amount of 0.0005 to 1% based on the total mass of the lubricating oil.

EXPERIMENT 1

The present invention will be more readily understood with reference to the following Examples in comparison with Comparative Examples; however, these Examples are intended to illustrate the invention and are not to be construed to limit the scope of the invention.

EXAMPLE 1-1

A generally semicylindrical test piece as a base material having a dimension of 8×12×40 mm was cut out from a raw material of S45C steel (according to JIS G4051). A DLC film was formed at the semicylindrical surface of this test piece by an arc ion plating process (PVD), thereby producing a specimen corresponding to a sliding part of a piston in an automotive internal combustion engine. The DLC thin film had a hydrogen atom content of not more than 0.5 atomic %, a Knoop hardness Hk of 2170 kg/mm$^2$, a maximum height Ry of 0.03 µm, and a thickness h of 0.5 µm. The maximum height Ry was explained as $R_z$ in JIS (Japanese Industrial Standard) B 0601 (:2001). Then, the specimen underwent a frictional wear test in which a material FC250 (according to JIS G5501) was used as an opposite specimen corresponding to the cylinder bore section (or the opposite member), the test being carried out in a lubricating oil containing no additive.

EXAMPLE 1-2

A generally semicylindrical test piece as a base material having a dimension of 8×12×40 mm was cut out from a raw material of S45C steel. A DLC thin film was formed at the semicylindrical surface of this test piece by an arc ion plating process (PVD), thereby producing a specimen corresponding to a sliding part of a piston in an automotive internal combustion engine. The DLC thin film had a hydrogen atom content of not more than 0.5 atomic %, a Knoop hardness Hk of 2170 kg/mm$^2$, a maximum height Ry of 0.03 µm, and a thickness h of 0.5 µm. Then, the specimen underwent a frictional wear test in which a material FC250 was used as an opposite specimen corresponding to the cylinder bore section, the test being carried out in a lubricating oil in which an ashless ester-based friction modifier was added to a base oil.

EXAMPLE 1-3

A procedure in Example 1-2 was repeated with the exception that the specimen underwent a frictional wear test in which a hyper-eutectic aluminum alloy was used as an opposite specimen corresponding to the cylinder bore section, the test being carried out in a lubricating oil in which an ester-based additive was added to a base oil.

COMPARATIVE EXAMPLE 1-1

A semicylindrical test piece as same as that in Example 1-1 was cut out from a raw material of S45C steel. A Cr thin film was formed at the semicylindrical surface of this test piece, thereby producing a specimen corresponding to a sliding part of a piston in an automotive internal combustion engine. Then, the specimen underwent a frictional wear test in which a material FC250 was used as an opposite specimen corresponding to the cylinder bore section, the test being carried out in a lubricating oil containing no additive.

COMPARATIVE EXAMPLE 1-2

A procedure in Comparative Example 1-1 was repeated with the exception that the specimen underwent a frictional wear test in which a hyper-eutectic aluminum alloy was used as an opposite specimen corresponding to the cylinder bore section, the test being carried out in a lubricating oil in which an ester-based additive was added to a base oil.

Here, the details of the lubricating oil used in the frictional wear tests were tabulated in Table 1 in which the lubricating oil A was used in Examples 1-2 and 1-3 and Comparative Example 1-2 while the lubricating oil B was used in Example 1-1 and Comparative Example 1-1.

TABLE 1

| Items | Lubricating oil A (mass % based on total amount of the lubricating oil) | Lubricating oil B (mass % based on total amount of the lubricating oil) |
|---|---|---|
| Base oil (mineral oil) | 87 | 100 |
| Additive | | |
| a) Ester friction modifier (glycerol monooleate) | 1.0 | — |
| b) Amine friction modifier (N,N-dipolyoxyethylene-N-oleylamine) | — | — |
| c) Ashless dispersant (polybutenyl succinimide) | 5.0 | — |
| d) Other additives (antioxidant, rust inhibitor and the like) | 7.0 | — |

[Evaluation of Performance]

Figure 2:
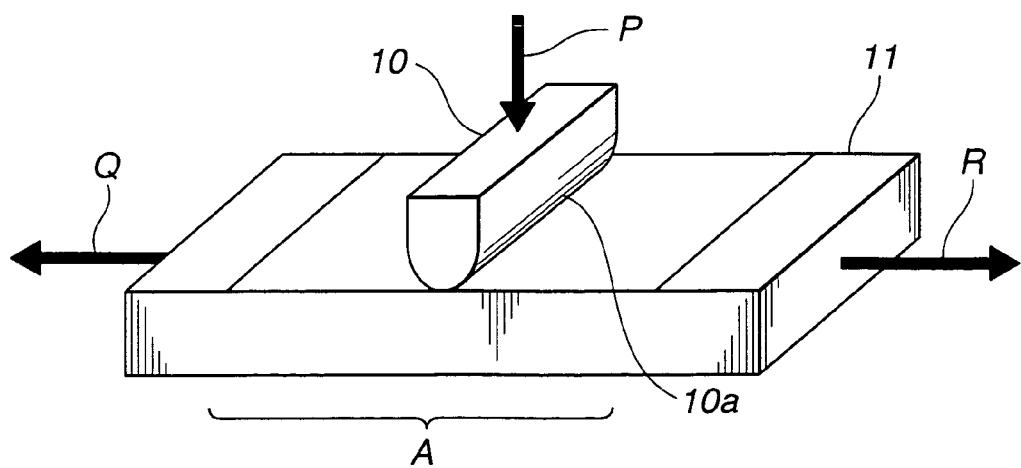
FIG. 2 is a perspective view of an essential part of a test apparatus for evaluation of Examples according to the first embodiment.

Each of the specimens of Examples and Comparative Examples underwent the frictional wear (reciprocating) test using a test apparatus shown in FIG. 2 in which a tip section (10a having the semicylindrical surface) of the specimen (10) of Examples and Comparative Examples was pressed on the surface of the plate-shaped opposite specimen (11) within a region A with a load P, upon which the specimen (10) made its reciprocating motion in directions of Q and R within the region A. During making the reciprocating motion of the specimen (10), a friction coefficient was measured at a turning end of the region A. Results of this test are tabulated in Table 2. The frictional wear (reciprocating) test was carried out under the following test conditions:

Specimen: Semicylindrical, having the dimension of 8×12×40 mm and formed of S45C steel;

Opposite specimen; plate-shaped, having a dimension of 40×60×7 mm, and formed of FC250 (hyper-eutectic aluminum alloy);

Test apparatus: Reciprocating motion-type and produced by Kabushiki Kaisha Kyouwa Giken;

Reciprocating motions of specimen. 600 cycles (reciprocating motions) per minute;

Test temperature: 25° C.;

Pressing load (P): 10 kgf,

Measuring time: 60 min. after initiation of the test.

TABLE 2

| Items | Friction coefficient |
|---|---|
| Example 1-1 | 0.08 |
| Example 1-2 | 0.05 |
| Example 1-3 | 0.03 |
| Comparative Example 1-1 | 0.13 |
| Comparative Example 1-2 | 0.11 |

Table 2 reveals that the specimens of Examples 1-1 to 1-3 corresponding to sliding members or parts of an automotive internal combustion engine are much lower in frictional coefficient than the specimens of Comparative Examples 1-1 and 1-2 corresponding to sliding members or parts of an automotive internal combustion engine. This proves that all the specimens of Examples 1-1 to 1-3 are excellent in scuffing resistance as compared with the specimens of Comparative Examples 1-1 and 1-2. The specimen of Example 1-3 is particularly largely low in friction coefficient, and therefore it is confirmed that further improvements in scuffing resistance and wear resistance are expected under combination of the hard carbon thin film of the sliding member, the hyper-eutectic aluminum alloy for the cylinder bore section and the lubricating oil containing the ester friction modifier. As a result, it is confirmed that a sharp lowering in friction can be realized in automotive internal combustion engines.

As appreciated from the above, according to the above embodiment of the present invention, it is possible to provide an automotive engine which is excellent in scuffing resistance and wear resistance while exhibiting a high friction lowering effect.

Second Embodiment

Next, a second embodiment of the piston for an internal combustion engine, according to the present invention will be discussed with reference to FIGS. 3A, 3B, 4A and 4B.

The piston of this embodiment is of the internal combustion engine of the automotive vehicle and includes a piston ring shown in FIGS. 3A and 3B or in FIGS. 4A and 4B. The piston ring has a sliding section which has a sliding surface in slidable contact with the opposite member in presence of the lubricating oil. The sliding surface of the sliding section is coated with the bard carbon thin film containing hydrogen atom in an amount of not more than 25 atomic %.

Here, the hard carbon thin film is mainly formed of carbon (element) and amorphous and takes a diamond structure ($SP^3$ bonding) or a graphite structure ($SP^2$ bonding) in bonding mode among carbons. More specifically, the hard carbon thin film is formed of hydrogen-free amorphous carbon (a-C) that consists of carbon, hydrogen-containing amorphous carbon (a-C:H), or metal amorphous carbon that contains as a part a metal element of titanium (Ti), Molybdenum (Mo) or the like.

As shown in FIGS. 3A and 3B illustrating an example of the piston ring, a side surface of the piston ring is normally in slidable contact with the cylinder bore section as the opposite member thereby making friction therebetween. The side surface serving as the sliding surface, of the piston ring is coated with the hard carbon thin film.

As shown in FIGS. 4A and 4B illustrating another example of the piston ring, upper and lower surfaces of the piston ring are coated with the hard carbon thin film as well as the side surface. It will be understood that the upper and lower surfaces of the piston ring are in slidable or movable contact with upper and lower wall surfaces defining the piston ring groove of the piston main body section in which the piston ring is fitted. The hard carbon thin film in this example can provide a friction lowering effect while improving a seizure resistance of the engine.

It will be understood that the whole surfaces of the piston ring may be coated with the hard carbon thin film. Additionally, the sliding surface (in slidable contact with the piston ring) of the cylinder bore section may be coated with the hard carbon thin film, which is a preferable example.

In this embodiment, from the viewpoint of obtaining a high friction lowering effect, it is preferable that the hydrogen content of the hard carbon thin film is suppressed as small as possible. It is preferable that the hydrogen content of the hard carbon thin film is preferably not more than 25 atomic %, more preferably not more than 5 atomic %, the most preferably more than 0.5 atomic %.

Since it is preferable that the hydrogen content is suppressed as small as possible, it is preferable to use the hard carbon thin film formed of the hydrogen-free amorphous carbon. The hard carbon thin film containing no hydrogen may be coated with the side surface and/or the upper and lower surfaces, or the whole surfaces of the piston ring.

It is preferable that the sliding surface of the sliding section of the piston ring is subjected to a surface treatment such as chromium plating, chromium nitride treatment or nitration, or a combination of these treatments, before the sliding surface is coated with the hard carbon thin film. Such surface treatment improves an adhesiveness of the hard carbon thin film and a durability of the hard carbon thin film.

Additionally, it is also preferable that the sliding surface of the sliding section of the piston ring has a surface roughness Ra of not larger than 0.1 μm before the sliding surface has been coated with the hard carbon thin film, from the viewpoint of obtaining stability in sliding. If the surface roughness exceeds 0.1 μm, local scuffing is formed while largely increasing a friction coefficient.

The hard carbon thin film is formed by a PVD process or a CVD process, or both PVD and CVD processes. The hard carbon thin film is preferably a DLC thin film. The processes are not limited to a particular one as far as the DLC thin film can be formed in a desired arrangement, in which an arc ion plating process is preferable.

The hard carbon thin film formed by PVD process or CVD process is high in internal stress of the film itself and remarkably high in hardness of the film as compared with a film formed by a surface treatment such as plating or the like. Accordingly, there may be the possibility that the film is peeled off from a base material or occurs its crack. Such possibility can be prevented by making the surface treatment mentioned above, forming a suitable intermediate layer between the film and the base material taking account of adhesiveness between them, or taking a multiple layer structure for the film thereby softening the internal stress of the film.

As mentioned above, the lubricating oil (composition) is used in combination with the piston ring of this embodiment, for the automotive internal combustion engine. The lubricating oil (composition) used in this embodiment is the same as that in the first embodiment discussed above.

EXPERIMENT 2

The present invention will be more readily understood with reference to the following Examples in comparison with Comparative Examples; however, these Examples are intended to illustrate the invention and are not to be construed to limit the scope of the invention.

EXAMPLE 2-1

A generally semicylindrical test piece as a base material having a dimension of 8×12×40 nm was cut out from a raw material of S45C steel. A DLC film was formed at the semicylindrical surface of this test piece by an arc ion plating process (PVD), thereby producing a specimen corresponding to a sliding part of a piston in an automotive internal combustion engine. The DLC thin film had a hydrogen atom content of not more than 0.5 atomic %, a Knoop hardness Hk of 2170 kg/mm², a maximum height Ry of 0.03 µm, and a thickness h of 0.5 µm. The maximum height Ry was explained as $R_z$ in JIS (Japanese Industrial Standard) B 0601 (:2001). Then, the specimen underwent a frictional wear test in which a material FC250 was used as an opposite specimen, the test being carried out using a base oil (PAO=poly alpha-olefin) containing no additive, as a lubricating oil.

EXAMPLE 2-2

A generally semicylindrical test piece as a base material having a dimension of 8×12×40 mm was cut out from a raw material of S45C steel. A DLC film was formed at the semicylindrical surface of this test piece by an arc ion plating process (PVD), thereby producing a specimen corresponding to a sliding part of a piston in an automotive internal combustion engine. The DLC thin film had a hydrogen atom content of not more than 0.5 atomic %, a Knoop hardness Hk of 2170 kg/mm², a maximum height Ry of 0.03 µm, and a thickness h of 0.5 µm. The maximum height Ry was explained as $R_z$ in JIS (Japanese Industrial Standard) B 0601 (:2001). Then, the specimen underwent a frictional wear test in which a material FC250 was used as an opposite specimen, the test being carried out using a base oil (PAO) containing an ashless ester friction modifier, as a lubricating oil.

COMPARATIVE EXAMPLE 2-1

A generally semicylindrical test piece as a base material having a dimension of 8×12×40 mm was cut out from a raw material of S45C steel. A film was formed at the semicylindrical surface of this test piece by a chromium plating treatment, thereby producing a specimen corresponding to a sliding part of a piston in an automotive internal combustion engine. Then, the specimen underwent a frictional wear test in which a material FC250 was used as an opposite specimen corresponding to the cylinder bore section, the test being carried out using a base oil (PAO) containing no additive, as a lubricating oil.

COMPARATIVE EXAMPLE 2-2

A generally semicylindrical test piece as a base material having a dimension of 8×12×40 mm was cut out from a raw material of S45C steel. A film was formed at the semicylindrical surface of this test piece by a chromium plating treatment, thereby producing a specimen corresponding to a sliding part of a piston in an automotive internal combustion engine. Then, the specimen underwent a frictional wear test in which a material FC250 was used as an opposite specimen corresponding to the cylinder bore section, the test being carried out using a base oil (PAO) containing no additive, as a lubricating oil.

[Evaluation of Performance]

Each of the specimens of Examples and Comparative Examples underwent the frictional wear (reciprocating) test using a test apparatus shown in FIG. 2 in which a tip section (10*a* having the semicylindrical surface) of the specimen (10) of Examples and Comparative Examples was pressed on the surface of the plate-shaped opposite specimen (11) within a region A with a load P, upon which the specimen (10) made its reciprocating motion in directions of Q and R within the region A. During making the reciprocating motion of the specimen (10), a friction coefficient was measured at a turning end of the region A. Results of this test are tabulated in Table 3. The frictional wear (reciprocating) test was carried out under the following test conditions:

Specimen: Semicylindrical, having the dimension of 8×12×40 mm and formed of S45C steel;

Opposite specimen: plate-shaped, having a dimension of 40×60×7 ml, and formed of FC250;

Test apparatus: Reciprocating motion-type;

Reciprocating motions of specimen: 600 cycles per minute;

Test temperature: 25° C.;

Pressing load (P): 98N;

Measuring time: 60 min. after initiation of the test.

TABLE 3

| Items | Friction coefficient |
|---|---|
| Example 2-1 | 0.08 |
| Example 2-2 | 0.05 |
| Comparative Example 2-1 | 0.13 |
| Comparative Example 2-2 | 0.11 |

Table 3 reveals that the specimens of Examples 2-1 and 2-2 are lower in frictional coefficient than the specimens of Comparative Examples 2-1 and 2-2 which are out of the aspect of the second embodiment. Additionally, it seems at the present time, that the specimen of Example 2-2 provides the best results upon employing combination of the sliding part or member coated with the hard carbon thin film and the lubricating oil (composition).

As appreciated from the above, according to the second embodiment, it has been found that a specified hard carbon thin film exhibits an excellent low friction characteristics in presence of a lubricating oil (composition), particularly a lubricating oil containing a specified ashless friction modifier. Accordingly, by combining the material (base material) of a sliding member or part whose sliding surface is coated with a certain hard carbon thin film with a certain lubricating oil (composition), it is made possible to provide a piston ring for an internal combustion engine of an automotive vehicle which piston ring exhibits an extremely excellent low friction characteristics while exhibiting a more fuel economy effect than a conventional combination of a steel material and an organic molybdenum compound.

Third Embodiment

Next, a third embodiment of the piston for an internal combustion engine, according to the present invention will be discussed with reference to FIGS. 5A, 5B, 6A and 6B.

As shown in FIGS. 5A and 5B, piston 21 of this embodiment is of an internal combustion engine of an automotive vehicle and includes a piston main body 21A. The piston main body 21A has a piston skirt section 22 whose outer peripheral surface is formed with extending streak-like grooves G which are arranged parallel with each other to have a certain pitch ranging from 15 to 30 µm. In other words, each streak-like groove G lies on an imaginary plane perpendicular to the axis of the piston. Each streak-like groove G has a depth ranging from 5 to 15 µm. In the piston 21, a part of the outer peripheral surface of the skirt section 22 in slidable contact with the wall surface of the cylinder bore section of a cylinder block (not shown) is coated with hard carbon thin film 25. This outer peripheral surface of the skirt section 22 corresponds to the outer peripheral surface formed with the streak-like grooves G. Each streak-like groove G is formed annular and lies on an imaginary vertical plane perpendicular the axis of piston 21, so that streak-like grooves G are formed parallel with each other.

Figure 6A:
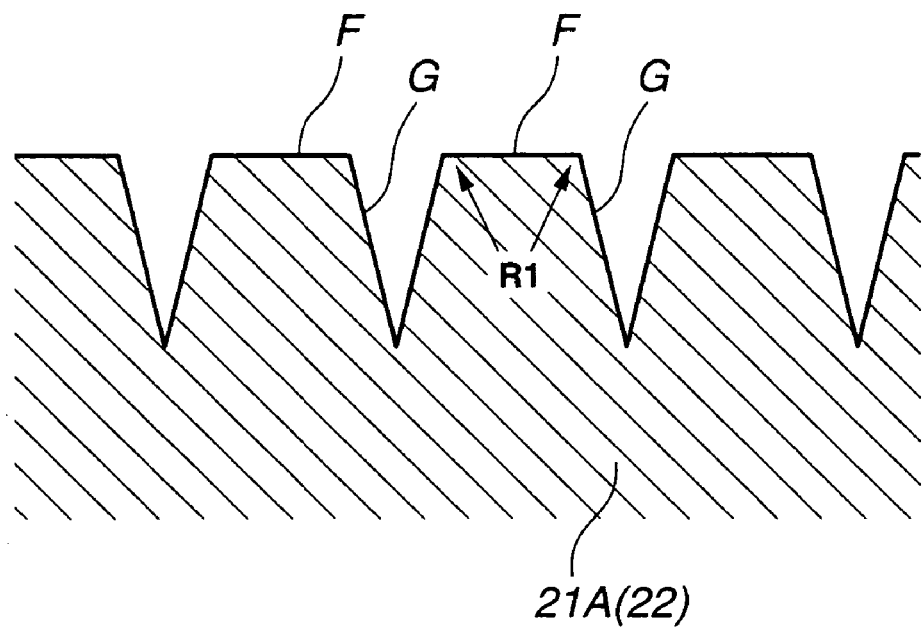
FIG. 6A is a fragmentary sectional view showing a shape of streak-like grooves formed at the surface of a piston skirt section of the piston of FIGS. 5A and 5B.
Figure 6B:
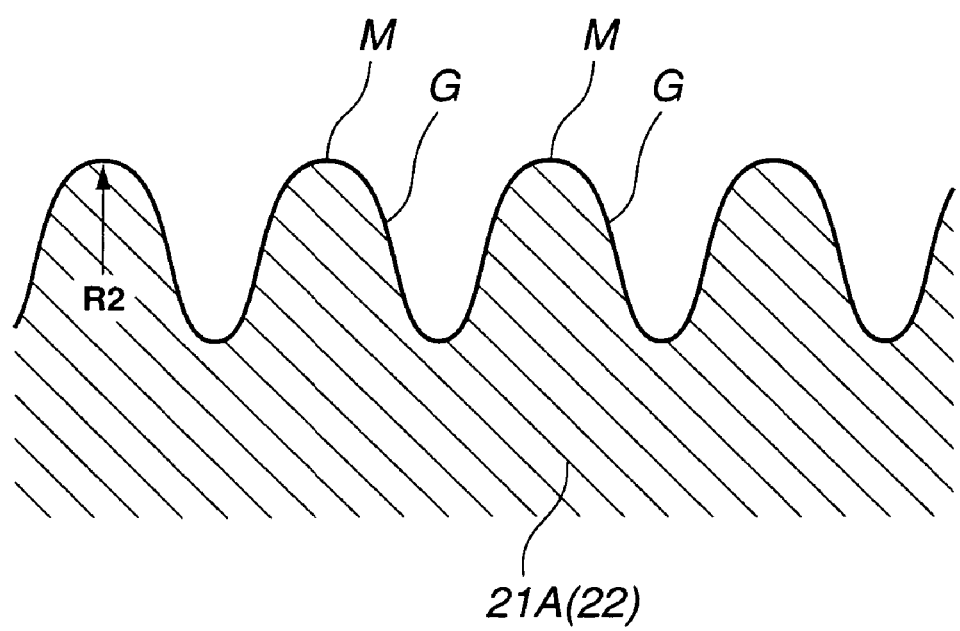
FIG. 6B is a fragmentary sectional view showing another shape of the streak-like grooves formed at the surface of the piston skirt section of the piston of FIGS. 5A and 5B.

Here, each streak-like groove G may take a variety of shapes such as ones shown in FIGS. 6A and 6B. As shown in FIG. 6A, an extending land-like portion (not identified) is formed between the adjacent two streak-like grooves G and has an extending flat top surface F. The land-like portion has two extending inclined wall surfaces (not identified) which are connected with each other through the flat top surface F to form two extending edges (not identified). The two extending edges may be rounded or chamfered as indicated by R1, in which the rounded edge preferably has a radius of curvature (R1)<1 µm in a cross-section perpendicular to the axis of the land-like portion. Otherwise, as shown in FIG. 6B, an extending land-like portion (not identified) is formed between the adjacent two streak-like grooves G and has an extending round top surface M. The land-like portion has two extending inclined wall surfaces (not identified) which are connected with each other through the round top surface M. The round top surface has a certain radius of curvature (R2) in the cross-section perpendicular to the axis of the land-like portion, in which the radius of curvature (R2) may be smaller than 1 µm. The streak-like grooves G discussed above may be formed, for example, by cutting or lapping. These streak-like grooves G contribute to largely smoothen the surface of the hard carbon thin film formed after formation of the streak-like ridges S while to maintain a uniform oil film.

In this embodiment, hard carbon thin film 25 is preferably a DLC (diamond-like carbon) thin film which is formed by a variety of PVD processes, preferably an arc ion plating process. This DLC thin film is formed mainly of carbon atom and amorphous. More specifically, the DLC thin film is formed of hydrogen-free amorphous carbon (a-C) that consists of carbon, hydrogen-containing amorphous carbon (a-C:H), or metal carbide or metal carbon (MeC) that contains as a part a metal element of titanium (Ti) or Molybdenum (Mo). For a significant reduction in friction, the DLC thin film is preferably not more than 1 atomic %, more preferably not more than 0.5 atomic %, and preferably formed of hydrogen-free amorphous carbon (a-C). hydrogen-free amorphous carbon (a-C) is preferably used.

Piston main body section 21A is formed of the base material such as iron-based material (steel) or aluminum-based material (aluminum alloy) and has a sliding section (not identified) which is in slidable contact with the opposite member such as the cylinder bore section. Piston main body section 21A preferably has a surface roughness Ra of not more than 0.01 µm, the surface roughness being of the sliding section which has not been coated with the hard carbon thin film. If the surface roughness of the sliding section exceeds 0.01 µm, projecting portions due to the surface roughness of the hard carbon thin film increases a local Hertz's contact pressure to the opposite member, thereby resulting in induction of formation of crack in the hard carbon thin film. The surface roughness Ra is explained as $R_{a75}$ in JIS (Japanese Industrial Standard) B 0601 (:2001).

Piston skirt section 22 of piston main body section 21A is in slidable contact with the wall surface of the cylinder bore section of the cylinder block in presence of lubricating oil (composition) which is the same as that in the first embodiment.

EXPERIMENT 3

The present invention will be more readily understood with reference to the following Examples in comparison with Comparative Examples; however, these Examples are intended to illustrate the invention and are not to be construed to limit the scope of the invention.

EXAMPLE 3-1

A test piece as a base material having a dimension of 12×18×5 mm was cut out from a raw material of aluminum alloy (AC8A according to JIS H5202). Streak-like grooves having a pitch of 20 µm and a depth of 10 µm were formed at the surface of the test piece. Thereafter, a DLC film was formed at the surface (formed with the streak-like grooves) of the test piece by an arc ion plating process (PVD), thereby producing a specimen corresponding to a piston main body section of a piston for an automotive internal combustion engine. The DLC thin film had a hydrogen atom content of not more than 0.5 atomic %, a Knoop hardness Hk of 2170 kg/mm², a maximum height Ry of 0.03 µm, and a thickness h of 0.5 µm. The maximum height Ry was explained as $R_z$ in JIS (Japanese Industrial Standard) B 0601 (:2001). Then, the specimen underwent a frictional wear test in which a material FC250 was used as an opposite specimen corresponding to a cylinder bore section, the test being carried out using a base oil (PAO) containing no additive, as a lubricating oil.

EXAMPLE 3-2

A test piece as a base material having a dimension of 12×18×5 mm was cut out from a raw material of aluminum alloy (AC8A). Extending streak-like grooves having a pitch of 20 µm and a depth of 10 µm were formed at the surface of the test piece. Then, the surface formed with the streak-like grooves was subjected to lapping thereby flattening the top part of each extending land-like portion located between the adjacent streak-like grooves so that a flat surface was formed at the top of each extending land-like portion. Thereafter, a DLC film was formed at the surface (formed with the streak-like grooves) of the test piece by an arc ion plating process (PVD), thereby producing a specimen corresponding to a piston main body section of a piston for an automotive internal combustion engine. The DLC thin film had a hydrogen atom content of not more than 0.5 atomic %, a Knoop hardness Hk of 2170 kg/mm², a maximum height Ry of 0.03 μm and a thickness h of 0.5 μm. The maximum height Ry was explained as $R_z$ in JIS (Japanese Industrial Standard) B 0601 (:2001). Then, the specimen underwent a frictional wear test in which a material FC250 was used as an opposite specimen corresponding to a cylinder bore section, the test being cared out using a base oil (PAO) containing no additive, as a lubricating oil.

EXAMPLE 3-3

A procedure in Example 3-2 was repeated with the exception that the specimen underwent a frictional wear test in which a material FC250 was used as an opposite specimen corresponding to the cylinder bore section, the test being carried out using a base oil (PAO) containing an ashless ester friction modifier, as a lubricating oil.

COMPARATIVE EXAMPLE 3-1

A test piece as same as that in Example 3-1 was cut out from a raw material of aluminum alloy (AC8A). A MoS₂ resin coat film having a thickness of 5 μm was formed at the surface of this test piece, thereby producing a specimen corresponding to a piston main body section of a piston for an automotive internal combustion engine. Then, the specimen underwent a frictional wear test in which a material FC250 was used as an opposite specimen corresponding to the cylinder bore section, the test being carried out using a base oil (PAO) containing no additive, as a lubricating oil.

COMPARATIVE EXAMPLE 3-2

A test piece as same as that in Example 3-1 was cut out from a raw material of aluminum alloy (AC8A). A TiN coat film was formed at the surface of this test piece, thereby producing a specimen corresponding to a piston main body section of a piston for an automotive internal combustion engine. Then, the specimen underwent a frictional wear test in which a material FC250 was used as an opposite specimen corresponding to the cylinder bore section, the test being carried out using a base oil (PAO) containing no additive, as a lubricating oil.

[Performance Evaluation]

Each specimen of Examples and Comparative Examples underwent a frictional wear test to measure a friction coefficient and a seizure load at which seizure occurs. In the frictional wear test, the specimen was pressed at a varying load on the opposite specimen which was rotating while the lubricating oil was dropped onto the surface of the opposite specimen in such a manner that the lubricating oil is supplied between the specimen and the opposite specimen. The frictional wear test was carried out under conditions set forth below. Results of the test are tabulated in Table 4.

<Test Conditions>

Specimen (Sliding member): having a dimension of 12×12×40 mm (formed of an aluminum alloy);

Opposite specimen (opposite member): having an outer diameter of 139 mm, an inner diameter of 105 mm and a thickness of 6 mm, hollow and disc-shaped, and formed of FC250;

Test apparatus: Frictional wear test apparatus (of a block-on-ring plate type) produced by Takachiho Seiki Co., Ltd.;

Rotating speed of Opposite Specimen: 2 m/sec.;

Test temperature: 25° C.; and

Load applied to the specimen: stepwise varied from 0 to 200 kgf.

TABLE 4

| Items | Friction coefficient | Seizure load (kgf) |
|---|---|---|
| Example 3-1 | 0.07 | 152 |
| Example 3-2 | 0.06 | 180 |
| Example 3-3 | 0.045 | 200 (seizure not occurred) |
| Comparative Example 3-1 | 0.12 | 95 |
| Comparative Example 3-2 | 0.10 | 110 |

Table 4 reveals that the specimens (corresponding to pistons of an internal combustion engine) of Examples 3-1 to 3-3 are largely low in friction coefficient and high in seizure load as compared with the specimens of Comparative Examples 3-1 and 3-2. This can prove that all the specimens of Examples 3-1 to 3-3 are excellent in scuffing resistance. Particularly in the specimen of Example 3-3, the friction coefficient is sharply lowered while avoiding occurrence of seizure. Accordingly, it is confirmed that improvements can be expected in scuffing resistance and wear resistance under combination of the hard carbon thin film and the lubricating oil containing the ashless ester friction modifier. As a result, it is confirmed that a great friction lowering can be realized in the piston for an internal combustion engine, according to this embodiment.

As appreciated from the above, according to this embodiment, it can be realized to provide a piston for an internal combustion engine, excellent in both scuffing resistance and wear resistance while exhibiting a large friction lowering effect.

Fourth Embodiment

Next, a fourth embodiment of the piston for an internal combustion engine, according to the present invention will be discussed.

In this embodiment, a sliding part or member (such as a piston skirt section of the piston) has a sliding section which is in slidable contact with an opposite member (such as the cylinder bore section) in presence of a lubricating oil. The sliding member is formed of a base material which is steel, aluminum-based alloy (material), or the like. The surface of the base material is coated with a hard carbon thin film through an intermediate layer. In other words, the intermediate layer is formed between the surface of the base material (at the sliding section) and the hard carbon thin film. The intermediate layer is formed of rubber, synthetic resin, or the like. By virtue of presence of the intermediate layer which is excellent in elasticity, the hard carbon thin film is increased in follow-up ability at its sliding section to the opposite member. This increases a contact area between the hard carbon thin film and the opposite member thereby maintaining a Hertz's contact pressure at a low level. Accordingly, in combination with the wear resistance and low friction characteristics of the hard carbon thin film serving as an outer (surface)-most layer, the friction coefficient and the wear amount of the sliding member can be sharply reduced.

Here, the hard carbon thin film is formed of a DLC (diamond-like carbon) which is mainly constituted of carbon (element). This DLC is amorphous and takes a diamond structure ($SP^3$ bonding) or a graphite structure ($SP^2$ bonding) in bonding mode among carbons. More specifically, the hard carbon (DLC) thin film is formed of hydrogen-free amorphous carbon (a-C) that consists of carbon, hydrogen-containing amorphous carbon (a-C:H), or metal carbide or metal carbon (MeC) that contains as a part a metal element of titanium (Ti) or Molybdenum (Mo). For a significant reduction in friction, the DLC thin film is preferably as low as possible in hydrogen content and therefore has a hydrogen content of not more than 1 atomic %, more preferably a hydrogen content of not more than 0.5 atomic %, and preferably formed of hydrogen-free amorphous carbon (a-C). From the viewpoint of particularly reducing the hydrogen content of an outer-most surface layer portion of the hard carbon thin film, the hard carbon thin film may take a multiple (two or more) layer structure in which the outer-most surface layer portion has a hydrogen content of not more than 0.5 atomic %.

The hard carbon thin film is formed by a known thin film forming technique such as a PVD process, a CVD process, a sputtering process or the like. Particularly by using the PVD process, the hard carbon thin film having a low hydrogen content can be formed. Accordingly, when the hard carbon thin film of the multiple layer structure is formed, an inner-side layer portion may be formed by CVD process while the outer-most surface layer portion may be formed by PVD process, so that the hydrogen content in the outer-most surface layer portion can be suppressed at a low level such as 0.5 atomic %.

It is preferable that the hard carbon thin film (coating) has a thickness ranging from 0.3 to 2.0 µm. If the thickness is smaller than 0.3 µm, wear tends to readily occur in the hard carbon thin film. If the thickness exceeds 2.0 µm, the hard carbon thin film tends to peel off owing to its brittle characteristics.

As the material of the intermediate layer, rubber or the synthetic resin having a melting point of not lower than 150° C. is used. The reason for using the synthetic resin having the melting point of not lower than 150° C. is that the temperature of engine oil (lubricating oil) used in the automotive internal combustion engine reaches 150° C. Examples of the material of the intermediate layer are polyamide Imide (PAI), polyimide (PI), rubber, polyetherether ketone (PEEK), polyamide (PA) and the like, in which these are used singly or in combination of two or more. Additionally, granular additives such as molybdenum disulfide (MoS2), tetrafluoroethylene (PTFE), graphite and the like may be added to the intermediate layer, in which these additives are used singly or in any combination. The granular additives serve to maintain a good µ (friction coefficient) characteristics during peeling-off of the hard carbon thin film. It is preferable that the intermediate layer has a thickness ranging from about 5 to about 20 µm from the viewpoint of reducing the Hertz's contact pressure at a contacting section between the hard carbon thin film and the surface of the opposite member.

The sliding member whose sliding section is coated with the hard carbon thin film is excellent in scuffing resistance against aluminum and therefore provides such a further effect as to obtain a low friction in case that the opposite member is formed of the aluminum-based alloy. In this connection, in a conventional technique intended to avoid a sliding contact between aluminum-based alloys of a piston skirt section and of the opposite member from the viewpoint of improving a scuffing resistance, there is an example in which a piston is iron-plated or coated with a resinous film in which flakes of stainless steel are dispersed; however, such a conventional piston is inferior in friction as compared with the piston coated with the DLC thin film.

The sliding member whose sliding section is coated with the hard carbon thin film according to this embodiment can be applied to, for example, a piston of an automotive internal combustion engine. In this case, it is preferable that the intermediate layer and the bard carbon thin film are formed on the piston skirt section whose surface has been previously formed with the streak-like grooves each of which lies generally on an imaginary plane perpendicular to the axis (or a sliding movement direction) of the piston. Each streak-like groove is annular so that the streak-like grooves are formed parallel with each other. The streak-like grooves provide unevenness to the surface of the piston skirt section so as to provide a lubricating oil carrying function, it is also preferable that the intermediate layer and the hard carbon thin film are formed not to have an extremely large thickness thereby preventing the unevenness due to the streak-like grooves from losing at the surface of the piston skirt section even after the intermediate layer and the hard carbon thin film are formed, thus maintaining a good lubricating oil carrying function.

Additionally, the sliding member whose sliding section is coated with the hard carbon thin film according to this embodiment may be applied to a bearing metal of the internal combustion engine. Also in this case, it is preferable that the intermediate layer and the hard carbon thin film are formed at the surface of the bearing metal in such a manner as to prevent the unevenness due to the streak-like grooves from losing at the surface of the bearing metal.

As discussed above, the sliding part (such as the piston skirt section of the piston) according to this embodiment is in slidable contact with the wall surface of the opposite member (such as the cylinder bore section) in presence of the lubricating oil (composition) which is the same as that in the first embodiment.

EXPERIMENT 4

The present invention will be more readily understood with reference to the following Examples in comparison with Comparative Examples; however, these Examples are intended to illustrate the invention and are not to be construed to limit the scope of the invention.

[Production of Block (Sliding Member)]

A base material having a dimension of 10 mm (length or in a stroke direction)×10 mm (width)×5 mm (thickness) was cut out from a raw material of a T6-treated material of AC8A or a hardened and tempered material of a carbon steel S45C for machine structural steel. Annularly extending streak-like grooves having a depth of 10 µm and a pitch of 200 µm were formed at the surface of the base material, the annular streak-like grooves lying on a plane perpendicular to the stroke direction. Then, a synthetic resin or rubber ("Material" in Table 5) dissolved in a solvent was coated on the surface (formed with the streak-like grooves) of the base material by a spray coating thereby forming an intermediate layer having a thickness ranging from 7 to 10 µm. Thereafter, a DLC thin film having a thickness of 1 µm was formed on the intermediate layer on the base material by a plasma CVD, thus producing a block (specimen) corresponding to a sliding member or part of this embodiment. In some Examples and Comparative Examples, the intermediate layer contained additive(s) (identified as "Additive" in the column of the intermediate layer in Table 5). Concerning the additive(s), the amount of $MoS_2$ was 20% by weight in case that it was singly used as the additive, whereas the amounts of $MoS_2$ and PTFE were respectively 20% by weight and 10% by weight in case that the both were used as the additives. In some Examples, an additional (outer or upper) layer of a DLC thin film having a thickness of 0.3 µm was formed on the above DLC thin film (formed by plasma CVD) by a PVD process under magnetron sputtering for the purpose of reducing the hydrogen content in the additional layer of the DLC thin film (identified as "CVD+ PVD" in Table 5). The above T6-treated material means a material which had been subjected to a solution treatment at 510° C. and for 4 hours and an aging treatment at 170° C. and for 10 hours in the case of AC8A.

In Examples and Comparative Examples in which a thin film of fluororubber or PEEK was used as the intermediate layer, the thin film was directly applied on the surface of the test piece cut out from the raw material without making the spray coating, upon streak-like grooves having a depth of 10 μm being directly formed at the surface of the thin film.

[Production of Plate (Opposite Member)]

A base material having a dimension of 60 mm (length or in the stroke direction)×40 nm (width)×10 mm (thickness) was cut out from a cast iron FC250 (according to JIS G5501). Then, the base material was polished to have a surface roughness Ra of 0.3 μm thereby producing a plate (identified as "FC250" in Table 5) as an opposite member to the above block (sliding member). In some Example (identified as "A390" in Table 5), a base material having a dimension of 60 mm (length or in the stroke direction)×40 mm (width)×10 mm (thickness) was cut out from an aluminum-based alloy A390 (according to ASTM A390). Then, the base material was polished to have a surface roughness Ra of not larger than 0.1 μm, and thereafter underwent an etching treatment in which primary crystal Si was projected from the α phase of aluminum by about 5 μm.

[Evaluation of Performance]

In order to evaluate performance of the above block (sliding member), the block underwent a frictional wear test of the type wherein the block was in slidable contact with the above plate (opposite member) and makes its vertical reciprocating motion in the above-mentioned stroke direction and opposite direction thereof upon being pressed at a pressing load. The frictional wear test took such a lubricating manner that lubricating oil was upwardly drawn when the block makes its return stroke at the bottom dead point of the reciprocating motion upon setting the oil surface of an oil bath for the lubricating oil at a position of 3 mm before (upward of) the bottom dead point of the reciprocating motion (vertical sliding movement) of the block. In this frictional wear test, a friction coefficient and a wear amount of each block (specimen) are measured. The frictional wear test was conducted under test conditions set forth below and using as the lubricating oil an automotive engine oil 5W30SH (identified as "Commercial" in Table 5) which was commercially available, or an experimental engine oil (identified as "Experimental" in Table 5) which was prepared by adding additive(s) (identified "Additive" in the column of the lubricating oil of Table 5) to the engine oil 5W30SH. Concerning the additive(s), the amount of the fatty acid ester was 0.5% by weight in case that the fatty acid was singly used as the additive, whereas the amounts of the fatty acid ester and the fatty acid amine were respectively 0.25% by weight and 0.25% by weight in case that the both were used as the additives. Results of this evaluation test are shown as "Evaluation results" in Table 5.

<Test Conditions>

Test apparatus: Vertically reciprocating motion type frictional wear test apparatus produced by Ohtomakkusu Kabushiki Kaisha;

Stroke of reciprocating motion: 40 mm;

Pressing load: 100 kgf;

Test time: 60 minutes;

Cycle (two strokes): 1500 cycles per minute;

Temperature of lubricating oil: 80° C.; and

Friction coefficient (as an evaluation result):

An average value in a cycle.

TABLE 5

| Items | | Base material | Block (sliding member) Intermediate layer Material | Additive | Process for forming hard carbon thin film | Material of plate | Lubricating oil Base | Kind | Additive | Evaluation results Friction coefficient | Wear amount (μm) | Reference |
|---|---|---|---|---|---|---|---|---|---|---|---|---|
| Example | 4-1 | AC8A | Polyamide imide | — | CVD | FC250 | 5W30SH | Commercial | | 0.06 | 0 | |
| | 4-2 | AC8A | Polyimide | — | CVD | FC250 | 5W30SH | Experimental | Fatty acid ester | 0.05 | 0 | |
| | 4-3 | AC8A | PEEK | — | CVD | FC250 | 5W30SH | Commercial | | 0.06 | 0 | |
| | 4-4 | AC8A | Fluororubber | — | CVD | FC250 | 5W30SH | Commercial | | 0.06 | 0 | |
| | 4-5 | AC8A | Polyamide imide | $MoS_2$ | CVD + PVD | FC250 | 5W30SH | Experimental | Fatty acid ester | 0.03 | 0 | |
| | 4-6 | S45C | Polyamide imide | PTFE, $MoS_2$ | CVD + PVD | A390 | 5W30SH | Commercial | | 0.05 | 0 | |
| Com. Example | 4-1 | AC8A | Polyamide imide | $MoS_2$ | — | FC250 | 5W30SH | Commercial | | 0.07 | 3 | |
| | 4-2 | AC8A | Polyimide | — | — | FC250 | 5W30SH | Commercial | | 0.12 | 5 | |
| | 4-3 | AC8A | PEEK | — | — | FC250 | 5W30SH | Commercial | | 0.14 | >10 | streak-like wear occurred |
| | 4-4 | AC8A | Polyamide imide | — | — | FC250 | 5W30SH | Experimental | Fatty acid ester | 0.10 | 5 | |
| | 4-5 | AC8A | None | — | — | FC250 | 5W30SH | Commercial | | 0.14 | 3 | |
| | 4-6 | S45C | Polyamide imide | PTFE, $MoS_2$ | — | FC250 | 5W30SH | Commercial | | 0.08 | 3 | |

Table 5 reveals that wear is hardly found in the blocks of Examples according to this embodiment in which the hard carbon thin film is coated on the intermediate layer formed of the synthetic resin or the like, so that existence of the streak-like grooves are found even after completion of the frictional wear test. Additionally, it is also confirmed that a friction lowering effect can be obtained by adding an oiliness agent such as an ester into the lubricating oil, and that a farther friction lowering effect can be obtained by forming a low hydrogen content hard carbon thin film using a PVD process.

In contrast, degradation in lubricating characteristics is found owing to wear of the streak-like grooves in all the blocks of Comparative Examples in which no hard carbon thin film is formed on the intermediate layer formed of the synthetic resin or the like. Even though a slight improvement effect in lubricating characteristics is found under addition of solid lubricant to a resin film (the intermediate layer), such an improvement effect cannot reach that of the blocks of Examples in which the hard carbon thin film is coated on the intermediate layer.

As appreciated from the above, according to this embodiment in which the hard carbon thin film such as one of the DLC material is coated on the sliding surface of the base material (of the sliding member) formed of steel or aluminum-based alloy through the intermediate layer formed of rubber or synthetic resin, the sliding member can be sharply lowered in friction coefficient and wear amount by virtue of presence of the hard carbon thin film excellent in wear resistance and having a low friction characteristics, formed on the intermediate layer excellent in elasticity.

The entire contents of Japanese Patent Applications P2003-167442 (filed Jun. 12, 2003), P2003-167440 (filed Jun. 12, 2003), P2003-167441 (filed Jun. 12, 2003), P2003-146076 (filed May 23, 2003) are incorporated herein by reference.

Although the invention has been described above by reference to certain embodiments and examples of the invention, the invention is not limited to the embodiments and examples described above. Modifications and variations of the embodiments and examples described above will occur to those skilled in the art in light of the above teachings. The scope of the invention is defined with reference to the following claims.

What is claimed is:

1. A piston for an internal combustion engine, comprising
a sliding part having a sliding section which is in slidable contact with an opposite member in presence of a lubricating oil; and
a hard carbon thin film coated on the sliding section of the sliding part,
wherein the lubricating oil comprises at least one friction modifier selected from the group consisting of an ashless fatty acid ester friction modifier and an ashless aliphatic amine friction modifier, the at least one friction modifier having a $C_6$-$C_{30}$ straight or branched hydrocarbon chain and being contained in an amount of 0.05 to 3.0% by mass based on a total mass of the lubricating oil; and
wherein the hard carbon thin film contains hydrogen atoms in an amount of not more than 1 atomic %.

2. A piston as claimed in claim 1, wherein the opposite member is a cylinder bore section of a cylinder block, formed of eutectic or hyper-eutectic aluminum alloy.

3. A piston as claimed in claim 2, wherein the sliding part is at least one of a piston ring and a piston main body section having a piston skirt section.

4. A piston as claimed in claim 1, wherein the hard carbon film contains hydrogen atom in an amount of not more than 0.5 atomic %.

5. A piston as claimed in claim 1, wherein the lubricating oil contains at least one compound selected from the group consisting of polybutenyl succinimide and a derivative of polybutenyl succinimide, in an amount of 0.1 to 15% by mass based on a total mass of the lubricating oil.

6. A piston as claimed in claim 2, wherein the lubricating oil contains zinc dithiophosphate in an amount of 0.1% or less by mass in terms of a phosphorus element based on a total mass of the lubricating oil.

7. A piston as claimed in claim 1, wherein the hard carbon thin film is a DLC thin film formed by a PVD process.

8. A piston as claimed in claim 2, wherein the sliding section of the sliding part has a surface roughness (Ra) of not larger than 0.03 μm in a condition before the sliding section is coated with the hard carbon thin film.

9. A piston as claimed in claim 1, wherein the sliding part is a piston ring, wherein the sliding section has a sliding surface which is coated with the hard carbon thin film.

10. A piston as claimed in claim 9, wherein the hard carbon thin film contains hydrogen atom in an amount of not more than 0.5 atomic %.

11. A piston as claimed in claim 9, wherein the piston ring has a contacting section whose contacting surface is in contact with a section of a main body section of the piston, the contacting section being coated with the hard carbon thin film.

12. A piston as claimed in claim 9, wherein the hard carbon thin film contains substantially no hydrogen atom.

13. A piston as claimed in claim 9, wherein the sliding surface of the a sliding section of the piston ring is subjected to at least a surface treatment selected from the group consisting of chromium plating, chromium nitride treatment and nitration, before the sliding surface is coated with the hard carbon thin film.

14. A piston as claimed in claim 9, wherein the sliding surface of the sliding section of the piston ring has a surface roughness (Ra) of not larger than 0.1 μm.

15. A piston as claimed in claim 9, wherein the hard carbon thin film is a diamond-like carbon thin film formed by at least one of a PVD process and CVD process.

16. A piston claimed in claim 9, wherein the hard carbon thin film is a diamond-like carbon thin film formed by a PVD process.

17. A piston as claimed in claim 9, wherein the lubricating oil contains at least one compound selected from the group consisting of polybutenyl succinimide and the derivative of the polybutenyl succinimide, in an amount of 0.1 to 15% by mass based on a total mass of the lubricating oil.

18. A piston as claimed in claim 9, wherein the lubricating oil contains zinc dithiophosphate in an amount of 0.1% or less by mass in terms of a phosphorus element based on a total mass of the lubricating oil.

19. A piston as claimed in claim 1, wherein the sliding part is a piston main body section having a piston skirt section, the piston skirt section having a sliding surface at which extending streak-like grooves are formed having a pitch ranging from 15 to 30 μm and a depth ranging from 5 to 15 μm, wherein the sliding surface is coated with the hard carbon thin film.

20. A piston as claimed in claim 19, wherein the streak-like grooves are arranged side by side to form an extending land-like portion between the adjacent two streak-like grooves, each land-like portion having an extending flat top surface, the flat top surface facing the opposite member.

21. A piston as claimed in claim 19, wherein the streak-like grooves are arranged side by side to form an extending land-like portion between adjacent two streak-like grooves, each land-like portion having an extending top surface having a radius of curvature (R1) smaller than 1 μm in cross-section perpendicular to axis of the land-like portion, the top surface facing the opposite member.

22. A piston as claimed in claim 19, wherein the lubricating oil contains at least one compound selected from the group consisting of polybutenyl succinimide and a derivative of polybutenyl succinimide, in an amount of 0.1 to 15% by mass based on a total mass of the lubricating oil.

23. A piston as claimed in claim 19, wherein the lubricating oil contains zinc dithiophosphate in an amount of 0.1% or less by mass in terms of a phosphorus element based on a total mass of the lubricating oil.

24. A piston as claimed in claim 23, wherein the hard carbon thin film contains hydrogen atom in an amount of not more than 0.5 atomic %.

25. A piston as claimed in claim 19, wherein the hard carbon thin film is a DLC thin film formed by a PVD process.

26. A piston as claimed in claim 19, wherein the sliding section of the sliding part has a surface roughness (Ra) of not larger than 0.01 μm in a condition before the sliding section is coated with the hard carbon thin film.

27. A piston as claimed in claim 1, wherein the sliding part is formed of a material selected from a group consisting of steel and aluminum-based alloy, wherein the piston further comprises an intermediate layer formed between the sliding section of the sliding part and the hard carbon thin film, the intermediate layer being formed of a material selected from group consisting of rubber and synthetic resin.

28. A piston as claimed in claim 27, wherein the intermediate layer comprises a granular additive.

29. A piston as claimed in claim 28, wherein the granular additive is at least one selected from the group consisting of molybdenum disulfide ($MoS_2$), tetrafluoroethylene resin (PTFE) and graphite.

30. A piston as claimed in claim 27, wherein the hard carbon thin film has an outer-most layer which contains hydrogen in an amount of not more than 0.5 atomic %.

31. A piston as claimed in claim 27, wherein the intermediate layer includes at least one material selected from the group consisting of polyamide imide (PAI), polyimide (PI), rubber, polyetherether ketone (PEEK) and polyamide (PA).

32. A piston as claimed in claim 27, wherein the hard carbon thin film is formed of diamond-like carbon (DLC).

33. A piston as claimed in claim 27, wherein the opposite member is formed of aluminum-based alloy.

34. A piston as claimed in claim 27, wherein the sliding part is a piston main body section of the piston, the piston main body section having a skirt section whose sliding section is formed with streak-like grooves, the intermediate layer and the hard carbon thin film being formed on the streak-like grooves.

35. A piston for an internal combustion engine according to claim 1, wherein the lubricating oil further comprises an additive selected from the group consisting of polybutenyl succinimide, a derivative of polybutenyl succinimide, zinc dithiophosphate, and a derivative of zinc dithiophosphate.

\* \* \* \* \*